United States Patent
Matsuzaki et al.

(10) Patent No.: US 8,818,545 B2
(45) Date of Patent: Aug. 26, 2014

(54) SEMICONDUCTOR FABRICATION APPARATUS AND TEMPERATURE ADJUSTMENT METHOD

(75) Inventors: Kazuyoshi Matsuzaki, Nirasaki (JP); Sumie Nagaseki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 384 days.

(21) Appl. No.: 13/259,893

(22) PCT Filed: Mar. 29, 2010

(86) PCT No.: PCT/JP2010/055569
§ 371 (c)(1),
(2), (4) Date: Sep. 30, 2011

(87) PCT Pub. No.: WO2010/113875
PCT Pub. Date: Oct. 7, 2010

(65) Prior Publication Data
US 2012/0016508 A1 Jan. 19, 2012

(30) Foreign Application Priority Data

Mar. 31, 2009 (JP) ................................ 2009-086927
Sep. 30, 2009 (JP) ................................ 2009-228051

(51) Int. Cl.
*G06F 19/00* (2011.01)
*H01L 21/67* (2006.01)
*H01J 37/32* (2006.01)

(52) U.S. Cl.
CPC .... *H01L 21/67109* (2013.01); *H01L 21/67248* (2013.01); *H01J 37/32522* (2013.01); *H01J 37/32623* (2013.01); *H01J 37/32449* (2013.01); *H01J 2237/2001* (2013.01); *H01L 21/67253* (2013.01)
USPC ............... 700/121; 700/110; 62/304; 62/315

(58) Field of Classification Search
USPC ...................... 700/108, 110, 121; 62/304, 315
See application file for complete search history.

(56) References Cited

U.S. PATENT DOCUMENTS 5,584,971 A * 12/1996 Komino .................... 204/192.13
5,660,740 A * 8/1997 Komino ......................... 216/67
(Continued)

FOREIGN PATENT DOCUMENTS

JP        07 235588        9/1995
JP      2001 044176        2/2001
(Continued)

OTHER PUBLICATIONS

International Search Report Issued Jun. 15, 2010 in PCT/JP10/055569 Filed Mar. 29, 2010.

*Primary Examiner* — Michael D Masinick
(74) *Attorney, Agent, or Firm* — Rothwell, Figg, Ernst & Manbeck, P.C.

(57) ABSTRACT

A semiconductor fabrication apparatus includes a semiconductor wafer mounting table having a cavity therein; and a nozzle which jets a liquefied temperature adjustment medium having a temperature equal to or less than a targeted temperature to an inner wall of the cavity in order to adjust a temperature of the semiconductor wafer mounting table to the targeted temperature. The semiconductor fabrication apparatus further includes a pressure detecting unit for detecting an internal pressure of the cavity; and a vacuum pump which discharges gas within the cavity such that a pressure detected by the pressure detecting unit becomes equal to or more than a saturated vapor pressure related to the temperature of the temperature adjustment medium jetted from the nozzle and equal to or less than a saturated vapor pressure related to the targeted temperature.

10 Claims, 27 Drawing Sheets

(56) References Cited

U.S. PATENT DOCUMENTS

| | | |
|---|---|---|
| 6,599,366 B1 * | 7/2003 | Kitano et al. .................. 118/666 |
| 6,629,423 B1 | 10/2003 | Hirooka et al. |
| 2005/0092013 A1 * | 5/2005 | Emoto ............................ 62/304 |
| 2010/0122774 A1 * | 5/2010 | Makabe et al. .......... 156/345.52 |

FOREIGN PATENT DOCUMENTS

| | | |
|---|---|---|
| JP | 2005 109375 | 4/2005 |
| WO | 99 41778 | 8/1999 |

\* cited by examiner

FIG. 26

| SYMBOL | SURFACE TREATMENT | CONTACT ANGLE[°C] |
|---|---|---|
| STD | ALUMINUM, NO SEPARATE TREATMENT | 98.9 |
| A-1 | AFTER ALUMINUM IS ANODE-OXIDIZED USING SULFURIC ACID, CEILING INNER WALL IS PUT IN BOILING WATER AND THEN SUBJECTED TO HYDRATION SEALING | 102.8 |
| A-2 | CEILING INNER WALL IS ANODE-OXIDIZED WITHIN LIQUID CONTAINING NON-AQUEOUS SOLVENT TO DISSOLVE WATER | 104.3 |
| A-3 | ETHYL-SILICATE IS IMPREGNATED INTO CEILING INNER WALL IN ANODE OXIDATION OF ALUMINUM USING OXALIC ACID | 103.9 |
| A-4 | AFTER ALUMINUM IS ANODE-OXIDIZED USING SULFURIC ACID, CEILING INNER WALL IS SUBJECTED TO NICKEL SALT SEALING | 99.5 |
| Y-1 | ALUMINA SPRAYING | 83.4 |
| Y-2 | EPOXY RESIN IS IMPREGNATED INTO COMPACT ALUMINA SPRAYING | 90.1 |
| Y-3 | COMPACT ALUMINA SPRAYING | 67.5 |
| AC-1 | GLASS IS COATED ON ANODE OXIDATION FILM OF ALUMINUM USING SULFURIC ACID | 55.3 |
| YC-1 | ALUMINA NANO PARTICLES ARE IMPACTED AND COATED AT HIGH SPEED | 102.3 |
| C-1 | COATING OF A COMPLEX OF RESIN AND CERAMICS | 129.1 |
| C-2 | COATING OF C, H AND O-BASED MATERIAL | 74.9 |
| C-3 | GLASS COATING | 65.1 |
| C-4 | FLUORO RESIN COATING | 99.9 |
| S-1 | ALUMINA IS SUBJECTED TO O3 TREATMENT AND OXIDIZED FILM IS STACKED | 105.1 |
| S-2 | FORMATION OF ANODE OXIDATION FILM OF ALUMINUM HAVING THICKNESS OF 8 μm | 104.8 |

SEMICONDUCTOR FABRICATION APPARATUS AND TEMPERATURE ADJUSTMENT METHOD

FIELD OF THE INVENTION

The present invention relates to a semiconductor fabrication apparatus with a temperature adjustment function of a semiconductor wafer mounting table and a method of adjusting temperature of the semiconductor wafer mounting table.

BACKGROUND OF THE INVENTION

A semiconductor fabrication apparatus includes a temperature adjustment device to keep a semiconductor wafer at a process temperature. The temperature adjustment device carries out temperature adjustment by circulating a liquid for temperature adjustment (hereinafter referred to a "temperature adjustment medium") in a passage formed inside the semiconductor wafer mounting table (for example see Patent Documents 1 and 2). Such a temperature adjustment method is called a "forced convection method."
Patent Document 1: Japanese Patent Application Publication No. 2001-44176
Patent Document 2: Japanese Patent Application Publication No. H7-235588

However, such forced convection type temperature adjustment has a limited passage heat transfer property, which results in difficulty in uniform semiconductor wafer temperature adjustment and poor responsiveness of temperature control. Of course, it may be considered that a fin or the like is provided inside the passage to improve the passage heat transfer property in order to increase the amount of heat exchange between a temperature adjustment medium and a temperature adjustment unit. However, there is a trade-off between the passage heat transfer property and a pressure loss. That is, improvement in the passage heat transfer property leads to increase in the pressure loss, which may result in increased power consumption of a pump to deliver the temperature adjustment medium. On the contrary, decrease in the pressure loss to achieve power saving leads to deterioration of the passage heat transfer property due to increase a temperature difference between an inlet side and an outlet side of the temperature adjustment medium, which results in difficulty in uniform temperature adjustment of the semiconductor wafer. Additionally, there is a need to consider arrangement of the passage in order to achieve the uniform temperature adjustment of the semiconductor wafer using the above-mentioned forced convection type temperature adjustment. However, since the semiconductor wafer mounting table is provided with various types of screws, lift pins, electrode parts and so on, there are various restrictions on a space for the passage and it is extremely difficult to achieve an optimization for passage design.

SUMMARY OF THE INVENTION

In view of such circumstances, it is an object of the invention to provide a semiconductor fabrication apparatus and a temperature adjustment method which are capable of achieving uniform temperature adjustment and high responsiveness of a semiconductor wafer, as compared to conventional temperature adjustment methods, by controlling an internal pressure of a cavity formed in a wafer mounting table such that a phase change of a temperature adjustment medium is caused in an inner wall of the cavity.

In accordance with a first aspect of the present invention, there is provided a semiconductor fabrication apparatus including a semiconductor wafer mounting table having a cavity therein; a nozzle which jets a liquefied temperature adjustment medium having a temperature equal to or less than a targeted temperature to an inner wall of the cavity in order to adjust a temperature of the semiconductor wafer mounting table to the targeted temperature; a pressure detecting unit for detecting an internal pressure of the cavity; and a vacuum pump which discharges gas within the cavity such that a pressure detected by the pressure detecting unit becomes equal to or more than a saturated vapor pressure related to the temperature of the temperature adjustment medium jetted from the nozzle and equal to or less than a saturated vapor pressure related to the targeted temperature.

The semiconductor fabrication apparatus may further include a temperature adjustment medium feeding hole which feeds a saturated vaporized temperature adjustment medium having a temperature equal to or more than the targeted temperature into the cavity in order to adjust the temperature of the semiconductor wafer mounting table to the targeted temperature; and a temperature detecting unit for detecting the temperature of the semiconductor wafer mounting table, wherein the vacuum pump is configured to discharge gas within the cavity such that, if the temperature detected by the temperature detecting unit exceeds the targeted temperature, a pressure detected by the pressure detecting unit becomes equal to or more than the saturated vapor pressure related to the temperature of the temperature adjustment medium jetted from the nozzle and equal to or less than the saturated vapor pressure related to the targeted temperature and discharge gas within the cavity such that, if the temperature detected by the temperature detecting unit is less than the targeted temperature, a pressure detected by the pressure detecting unit becomes equal to or more than the saturated vapor pressure related to the targeted temperature and equal to or less than a saturated vapor pressure related to the temperature of the temperature adjustment medium fed from the temperature adjustment medium feeding hole.

In accordance with a second aspect of the present invention, there is provided a semiconductor fabrication apparatus including a semiconductor wafer mounting table having a cavity therein; a temperature adjustment medium feeding hole which feeds a saturated vaporized temperature adjustment medium having a temperature equal to or more than a targeted temperature into the cavity in order to adjust a temperature of the semiconductor wafer mounting table to the targeted temperature; a pressure detecting unit for detecting an internal pressure of the cavity; and a vacuum pump which discharges gas within the cavity such that a pressure detected by the pressure detecting unit becomes equal to or more than a saturated vapor pressure related to the targeted temperature and equal to or less than a saturated vapor pressure related to the temperature of the temperature adjustment medium fed from the temperature adjustment medium feeding hole.

The inner wall of the cavity may be inclined with respect to a mounting surface of the semiconductor wafer.

In accordance with a third aspect of the present invention, there is provided a temperature adjustment method for adjusting a temperature of a semiconductor wafer mounting table having a cavity therein to a targeted temperature by jetting a liquefied temperature adjustment medium having a temperature equal to or less than the targeted temperature to an inner wall of the cavity, the method including: detecting an internal pressure of the cavity; and discharging gas within the cavity such that the detected pressure becomes equal to or more than a saturated vapor pressure related to the temperature of the temperature adjustment medium jetted to the inner wall of the cavity and equal to or less than a saturated vapor pressure related to the targeted temperature.

In accordance with a fourth aspect of the present invention, there is provided a temperature adjustment method for adjusting a temperature of a semiconductor wafer mounting table having a cavity therein to a targeted temperature by detecting the temperature of the semiconductor wafer mounting table, jetting a liquefied temperature adjustment medium having a temperature equal to or less than the targeted temperature to an inner wall of the cavity if the detected temperature exceeds the targeted temperature, and feeding a saturated vaporized temperature adjustment medium having a temperature equal to or more than the targeted temperature into the cavity if the detected temperature is less than the targeted temperature, the method including: detecting an internal pressure of the cavity; discharging gas within the cavity such that, if the detected temperature exceeds the targeted temperature, the detected pressure becomes equal to or more than a saturated vapor pressure related to the temperature of the temperature adjustment medium jetted to the inner wall of the cavity and equal to or less than a saturated vapor pressure related to the targeted temperature; and discharging gas within the cavity such that, if the detected temperature is less than the targeted temperature, the detected pressure becomes equal to or more than the saturated vapor pressure related to the targeted temperature and equal to or less than a saturated vapor pressure related to the temperature of the temperature adjustment medium fed into the cavity.

In accordance with a fifth aspect of the present invention, there is provided a temperature adjustment method for adjusting a temperature of a semiconductor wafer mounting table having a cavity therein to a targeted temperature by feeding a saturated vaporized temperature adjustment medium having a temperature equal to or more than the targeted temperature into the cavity, the method comprising: detecting an internal pressure of the cavity; and discharging gas within the cavity such that the detected pressure becomes equal to or more than a saturated vapor pressure related to the targeted temperature and equal to or less than a saturated vapor pressure related to the temperature of the temperature adjustment medium fed into the cavity.

In the present invention, the cavity for temperature adjustment is formed inside the semiconductor wafer mounting table. If a temperature of the semiconductor wafer mounting table exceeds the targeted temperature, the temperature adjustment medium having a temperature equal to or less than the targeted temperature is jetted to the inner wall of the cavity. The pressure detecting unit detects an internal pressure of the cavity and the vacuum pump discharges gas within the cavity such that the internal pressure of the cavity is within a particular range of pressure. The particular range of pressure is equal to or more than a saturated vapor pressure related to a temperature of the temperature adjustment medium jetted to the inner wall of the cavity and equal to or less than the saturated vapor pressure related to the targeted temperature. For this reason, the temperature adjustment medium before it contacts the inner wall of the cavity is liquid. Since the temperature of the temperature adjustment medium contacting the inner wall is increased to exceed the targeted temperature, the medium is changed to be gaseous. This allows cooling of the semiconductor wafer mounting table by latent heat of the temperature adjustment medium.

In the present invention, the temperature detecting unit detects the temperature of the mounting table.

If the temperature of the semiconductor wafer mounting table exceeds the targeted temperature, the temperature adjustment medium having a temperature equal to or less than the targeted temperature is jetted to the inner wall of the cavity. As described above, the vacuum pump discharges gas within the cavity such that the internal pressure of the cavity is equal to or more than a saturated vapor pressure related to a temperature of the temperature adjustment medium jetted to the inner wall of the cavity and equal to or less than a saturated vapor pressure related to the targeted temperature. This allows cooling of the semiconductor wafer mounting table by latent heat of the temperature adjustment medium.

On the other hand, if the temperature of the semiconductor wafer mounting table is less than the targeted temperature, a temperature adjustment medium having a temperature equal to or more than the targeted temperature is fed into the cavity. The vacuum pump discharges gas within the cavity such that the internal pressure of the cavity is equal to or more than a saturated vapor pressure related to the targeted temperature and equal to or less than a saturated vapor pressure related to the temperature of the temperature adjustment medium fed into the inner wall of the cavity. For this reason, the temperature adjustment medium before it contacts the inner wall of the cavity is gas. Since the temperature of the temperature adjustment medium contacting the inner wall is decreased to be less than the targeted temperature, the medium is changed to be liquefied. This allows heating of the semiconductor wafer mounting table by latent heat of the temperature adjustment medium.

In the present invention, the cavity for temperature adjustment is formed inside the semiconductor wafer mounting table. If a temperature of the semiconductor wafer mounting table is less than a targeted temperature, a temperature adjustment medium having a temperature equal to or more than the targeted temperature is fed into the cavity. The vacuum pump discharges gas within the cavity such that an internal pressure of the cavity is within a particular range of pressure. The particular range of pressure is equal to or more than a saturated vapor pressure related to the targeted temperature and equal to or less than a saturated vapor pressure related to the temperature of the temperature adjustment medium fed into the cavity. For this reason, the temperature adjustment medium before it contacts the inner wall of the cavity is gas. Since the temperature of the temperature adjustment medium contacting the inner wall is decreased to be less than the targeted temperature, the medium is changed to be liquefied. This allows heating of the semiconductor wafer mounting table by latent heat of the temperature adjustment medium.

In the present invention, the inner wall of the cavity formed in the semiconductor mounting table is inclined with respect to a mounting surface of a semiconductor wafer. This allows the liquefied temperature adjustment medium adhered to the inner wall of the cavity to move along the inner wall. This allows more efficient cooling or heating of the semiconductor mounting table.

EFFECTS OF THE INVENTION

It is possible to achieve uniform temperature adjustment and high responsiveness of the semiconductor wafer as compared to conventional temperature adjustment methods.

BRIEF DESCRIPTION OF THE DRAWINGS

FIG. 26 shows a table listing details of the surface treatment.

DETAILED DESCRIPTION OF THE EMBODIMENT

Hereinafter, embodiments of the present invention will be described in detail with reference to the drawings.

Figure 1:
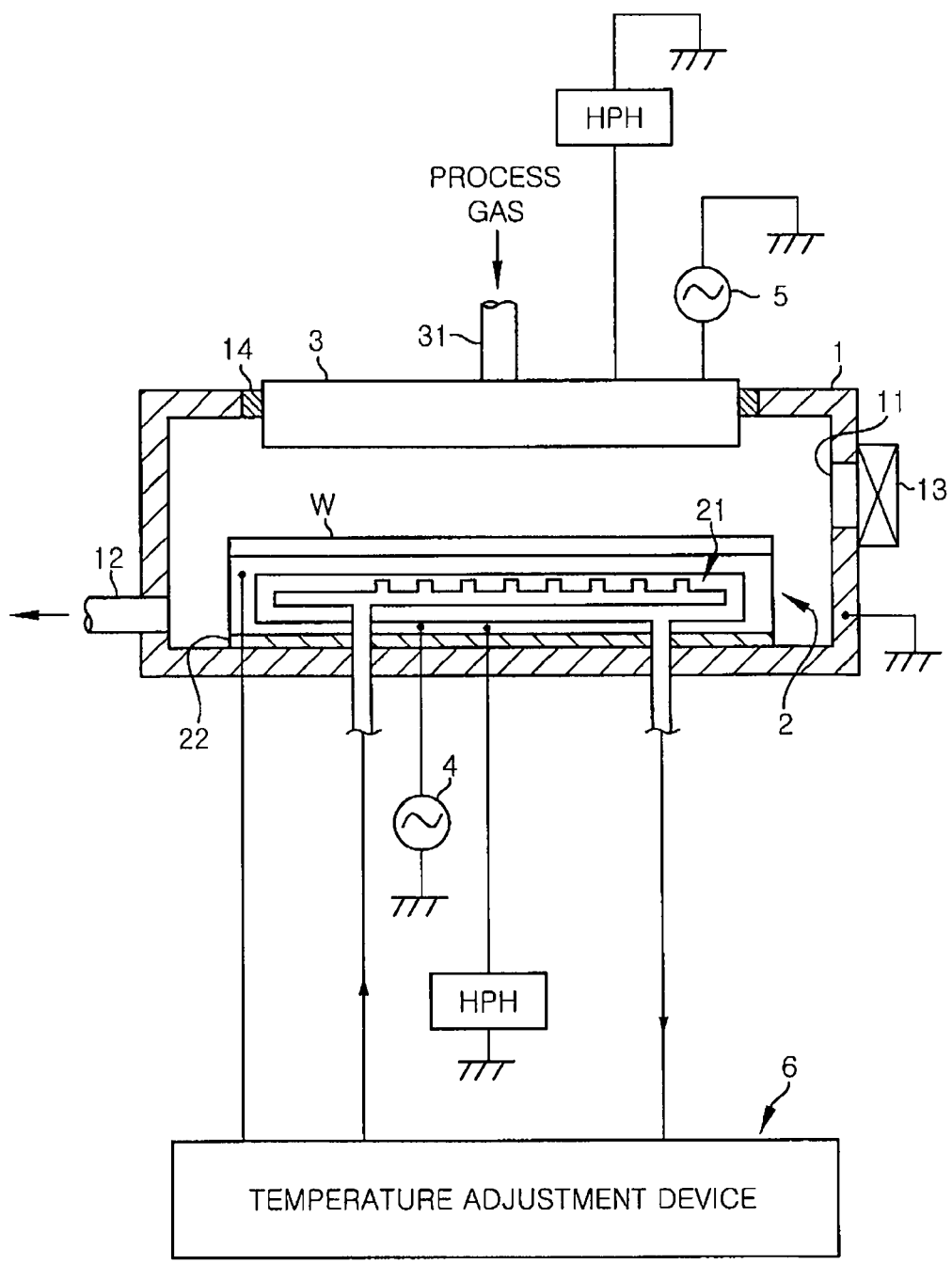
FIG. 1 is a schematic view showing a structure of a semiconductor fabrication apparatus according to Embodiment 1 of the present invention.

FIG. 1 is a schematic view showing a structure of a semiconductor fabrication apparatus according to Embodiment 1 of the present invention. The semiconductor fabrication apparatus according to Embodiment 1 is, for example, a parallel flat plasma etching apparatus which is merely one example of a plasma processing apparatus. The semiconductor fabrication apparatus includes a hollow cylindrical processing container 1. The processing container 1 is made of, for example, aluminum and is grounded.

A disc-like wafer mounting table 2 (semiconductor wafer mounting table) which mounts a semiconductor wafer W and acts as a lower electrode is provided in the central portion of the bottom of the processing container 1 via a disc-like insulator 22. The wafer mounting table 2 is made of, for example, aluminum or copper and has a cavity 21 therein which is used to adjust temperature of the mounted semiconductor wafer W and is connected with a temperature adjustment device 6 which will be described later. A high frequency power supply 4 for bias application is also connected to the wafer mounting table 2.

In addition, an upper electrode 3 is arranged to face the wafer mounting table 2 is provided in the central portion of the ceiling of the processing container 1. An annular insulator 14 is interposed between the processing container 1 and the upper electrode 3. A high frequency power supply 5 for plasma generation is connected to the upper electrode 3. The upper electrode 3 is formed to be hollow and forms a gas shower head having a plurality of process gas feeding holes (not shown). A process gas feeding pipe 31 to feed process gas to the upper electrode 3 is provided in the center of the top of the upper electrode which then feeds the process gas into the processing container 1.

An exhausting pipe 12 is connected to the side near the bottom of the processing container 1 and it is configured that the processing container 1 is exhausted to vacuum by means of a vacuum pump (not shown) provided in the downstream of the exhausting pipe 12.

A carrying hole 11 for the semiconductor wafer W is formed in the side of the processing container 1 and is configured to be opened/closed by a gate valve 13.

Figure 2:
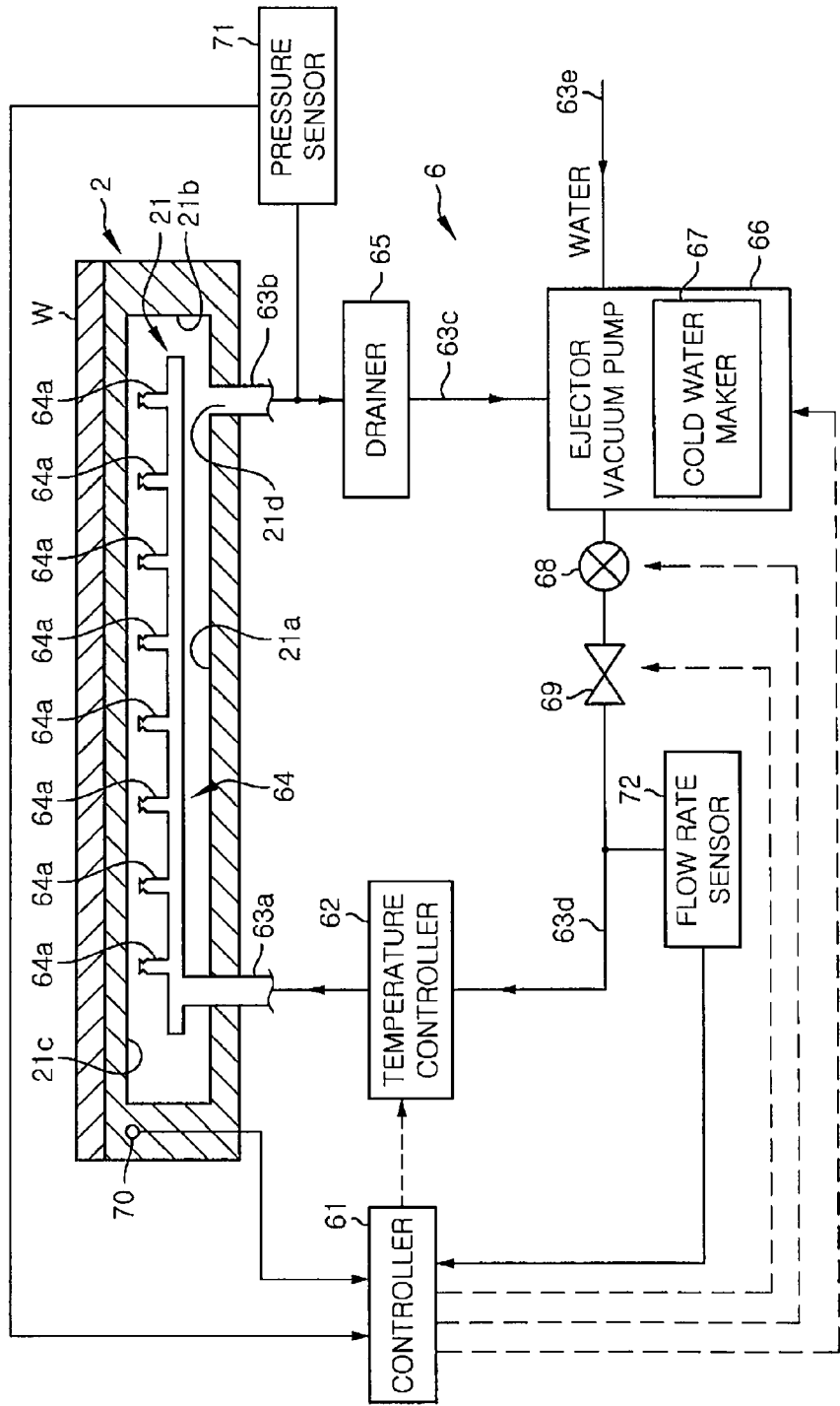
FIG. 2 is a schematic view showing a wafer mounting table and a temperature adjustment device.

FIG. 2 is a schematic view showing the wafer mounting table 2 and the temperature adjustment device 6. The cavity 21 formed in the wafer mounting table 2 has a cylindrical shape including a circular bottom inner wall 21a, a circumferential wall 21b and a circular ceiling inner wall 21c. The bottom inner wall 21a has a discharging hole 21d to discharge gas and water from the cavity 21 at an appropriate place.

The temperature adjustment device 6 includes a controller 61 to control operation of other components. The controller 61 is, for example, a microcomputer having a CPU which has a computer program required for operation of the controller 61, a storage storing various types of information such as process temperature (target temperature) required for a semiconductor fabrication process, an input/output unit to input/output various types of information and control signals, etc.

The temperature adjustment device 6 further includes a temperature controller 62 required for temperature adjustment of the wafer mounting table 2, a water jet 64, a drainer 65, an ejector vacuum pump 66, a cold water maker 67, a water feeding pump 68 and a flow rate control valve 69.

The temperature controller 62 feedback-controls temperature of cold water fed from the cold water maker 67, which will be described later, to reach a predetermined temperature according to a control signal from the controller 61 and feeds the temperature-controlled water to the water jet 64 via a pipe 63a.

The water jet 64 is arranged inside the cavity 21 of the wafer mounting table 2. The water jet 64 has a hollow disc shape having a diameter smaller than that of the ceiling inner wall 21c and includes a base communicating to the pipe 63a and nozzles 64a distributed at the side of the ceiling inner wall 21c of the base. The water jet 64 is configured to jet the water fed from the temperature controller 62 to the ceiling inner wall 21c substantially uniformly.

The drainer 65 is connected to the discharging hole 21d of the wafer mounting table 2 by a pipe 63b and the ejector vacuum pump 66 by a pipe 63c. The drainer 65 receives the water discharged via the discharging hole 21d and the pipe 63b and feeds the water to the ejector vacuum pump 66 via the pipe 63c. In addition, the drainer 65 feeds vapor discharged via the discharging hole 21d and the pipe 63b to the ejector vacuum pump 66 via the pipe 63c.

Figure 3:
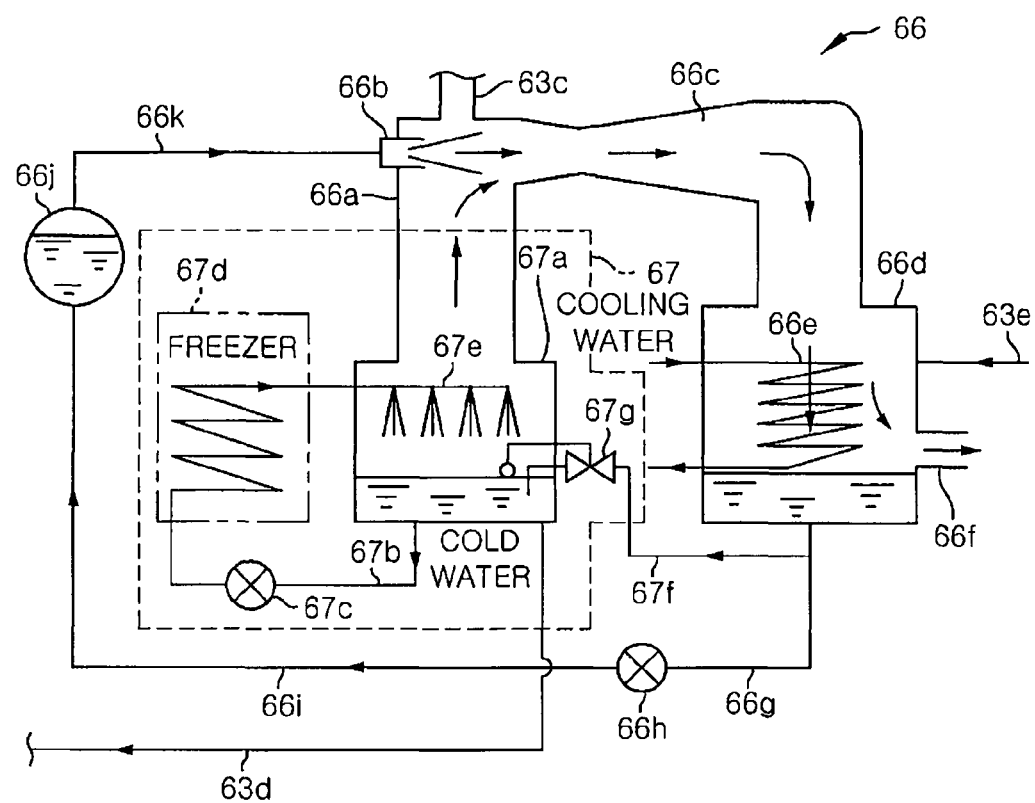
FIG. 3 is a schematic view showing a structure of an ejector vacuum pump and a cold water maker.

FIG. 3 is a schematic view showing a structure of the ejector vacuum pump 66 and the cold water maker 67. The ejector vacuum pump 66 includes a water tank 66d storing the water fed via a pipe 63e, a force pump 66h to force the water of the water tank 66d to be transferred via pipes 66g and 66i, a vacuum vessel 66j to generate vapor from the transferred water, an ejector nozzle 66b to jet the vapor fed from the vacuum vessel 66j via a pipe 66k, a suction chamber 66a in which the ejector nozzle 66b is placed, and a diffuser 66c. The suction chamber 66a communicates to the pipe 63c. In particular, the water tank 66d is provided with a condenser 66e to condense the vapor discharged out of the cavity 21 of the wafer mounting table 2. In addition, an overflow pipe 66f is provided at an appropriate place of the water tank 66d.

The above-configured ejector vacuum pump 66 feeds the water of the water tank 66d to the ejector nozzle 66b by means of the force pump 66h and generates a vacuum suction force in the suction chamber 66a by circulating the water via the diffuser 66c and the water tank 66d. The ejector vacuum pump 66 uses the vacuum suction force to discharge from the cavity 21 a temperature adjustment medium, i.e., the water, of gas within the cavity 21 and liquid remaining within the cavity 21. More specifically, when the wafer mounting table 2 is cooled, the ejector vacuum pump 66 discharges not only evaporated vapor but also water not evaporated out of the cavity 21. In addition, when the wafer mounting table 2 is heated, the ejector vacuum pump 66 discharges not only vapor but also condensed water out of the cavity 21.

The cold water maker 67 includes a cold water tank 67a communicating to the suction chamber 66a, a pipe 67f for feeding water from the water tank 66d into the cold water tank 67a, a float valve 67g provided in the pipe 67f, a cold water making force pump 67c to force the water of the cold water tank 67a to be transferred via a pipe 67b, a freezer 67d to cool the transferred water, and an evaporator 67e disposed within the cold water tank 67a. Some of water jetted from the evaporator 67e is evaporated into vapor and the remaining water is cooled by depriving it of latent heat required for the evaporation.

The cold water tank 67a is configured to communicate to a pipe 63d through which cold water is transferred from the cold water tank 67a to the temperature controller 62.

The water feeding pump 68 is disposed in the course of the pipe 63d. The water feeding pump 68 is, for example, a diaphragm type pump. The water feeding pump 68 is driven according to a control signal from the controller 61 and delivers the cold water of the cold water maker 67 to the temperature controller 62.

The flow rate control valve 69 is disposed in the course of the pipe 63d near the temperature controller 62 rather than the water feeding pump 68. The flow rate control valve 69 controls a flow rate of the water delivered from the water feeding pump 68 according to a control signal from the controller 61 and delivers the water with the controlled flow rate to the temperature controller 62.

The temperature adjustment device 6 also includes a temperature sensor (temperature detecting unit) 70, a pressure sensor (pressure detecting unit) 71 and a flow rate sensor 72. The temperature sensor 70 is, for example, a thermocouple thermometer buried in an appropriate place of the wafer mounting table 2. The temperature sensor 70 detects the temperature of the wafer mounting table 2 and outputs information on the detected temperature to the controller 61. The pressure sensor 71 is connected to the pipes 63, detects the internal pressure of the cavity 21 and outputs information on the detected pressure to the controller 61. The flow rate sensor 72 detects a flow rate of water flowing through the pipe 63d and outputs information on the detected flow rate to the controller 61. The controller 61 receives the information on the temperature, pressure and flow rate via an input/output part, performs a process related to cooling based on the received information, and provides the ejector vacuum pump 66, the water feeding pump 68 and the flow rate control valve 69 with control signals for controlling the respective operation.

Figure 4A:
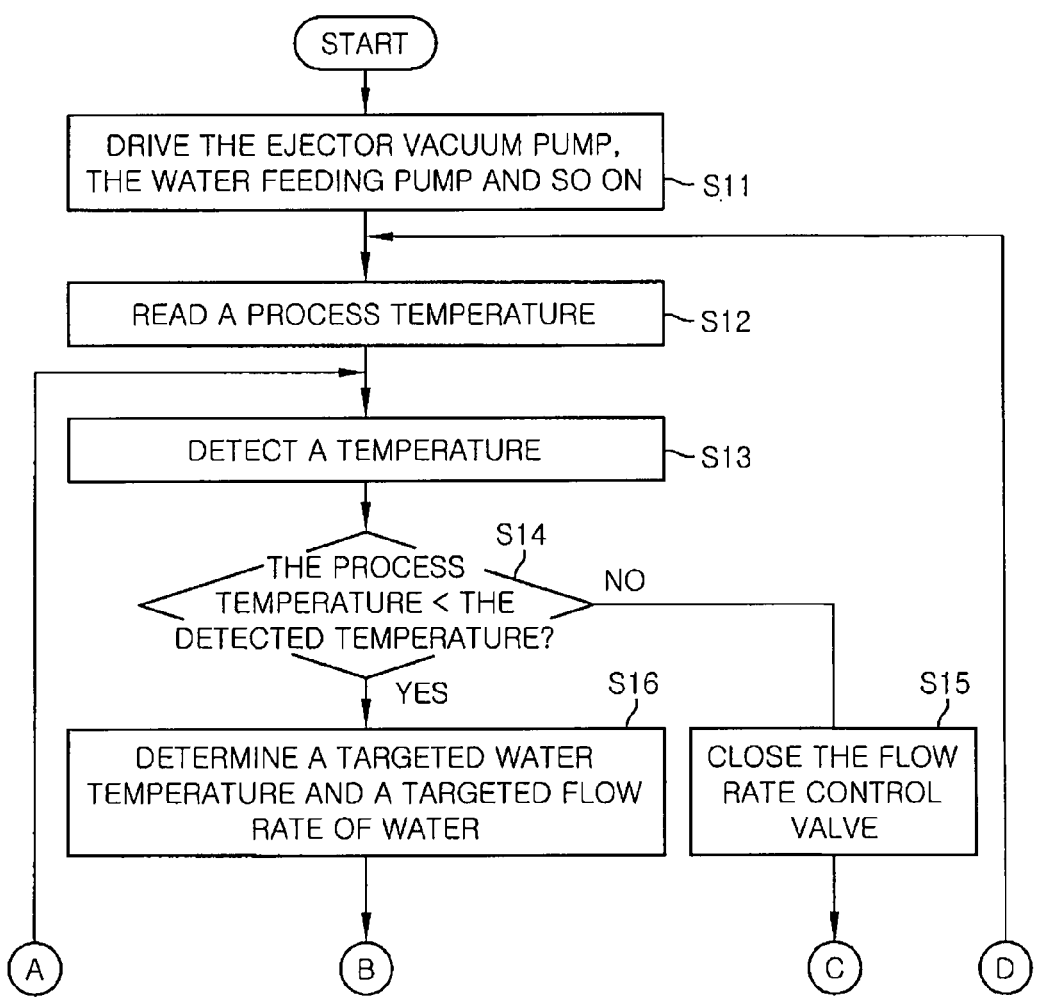
FIGS. 4A and 4B are a flow chart showing a process of a controller related to cooling.
Figure 4B:
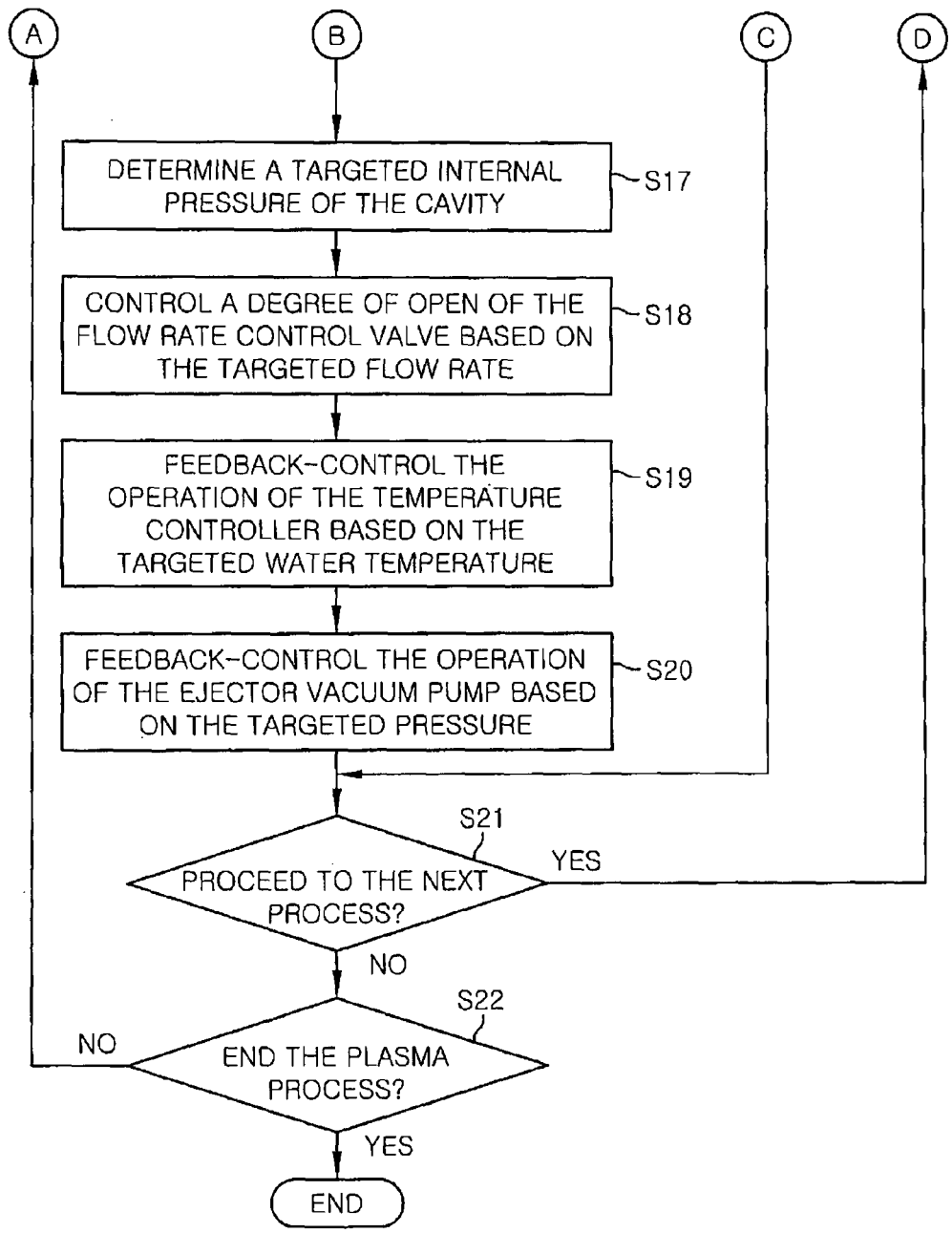

FIGS. 4A and 4B are a flow chart showing a process of the controller 61 related to cooling. The controller 61 drives the ejector vacuum pump 66, the water feeding pump 68 and so on (Step S11). Then, the controller 61 reads a process temperature from the storage (not shown) (Step S12). Next, the controller 61 detects a temperature from the temperature sensor 70 (Step S13).

Then, the controller 61 determines whether or not the temperature detected from the temperature sensor 70 exceeds the process temperature (Step S14). The temperature detected from the temperature sensor 70 is hereinafter referred to as a detected temperature. If the detected temperature is equal to or less than the process temperature (NO in Step S14), the controller 61 controls the flow rate control valve 69 to be closed (Step S15).

If it is determined that the detected temperature exceeds the process temperature (YES in Step S14), the controller 61 determines a targeted water temperature and a targeted flow rate of water to be jetted to the ceiling inner wall 21c (Step S16) and determines a targeted internal pressure of the cavity 21 (Step S17). The targeted water temperature, the targeted flow rate and the targeted internal pressure will be described below.

Figure 5:
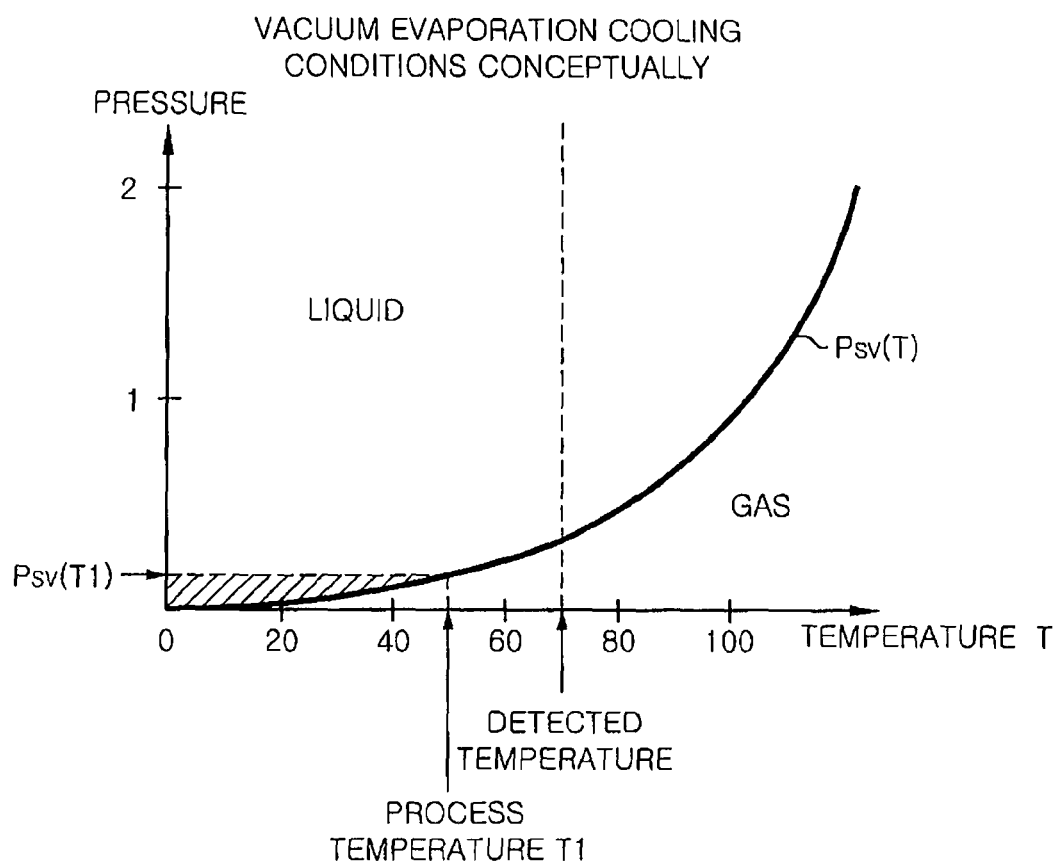
FIG. 5 is a state diagram showing vacuum evaporation cooling conditions conceptually.

FIG. 5 is a state diagram showing vacuum evaporation cooling conditions conceptually. In this graph, a horizontal axis represents temperature and a vertical axis represents pressure. A curve in the graph represents a saturated vapor pressure Psv(T) of water, which is a function of temperature T. If the detected temperature exceeds the process temperature T1, the controller 61 determines the targeted water temperature and the targeted pressure within a range of temperature and pressure, which is indicated by oblique lines. The internal pressure of the cavity 21 within the temperature and pressure range indicated by oblique lines corresponds to equal to or more than the saturated vapor pressure Psv(T) with respect to the temperature T of the water jetted from the nozzles 64a and equal to or less than a saturated vapor pressure P with respect to the process temperature T1. For example, the same temperature as the process temperature T1 may be set to the targeted water temperature and the saturated vapor pressure Psv(T1) with respect to the process temperature T1 may be set to the targeted pressure.

The flow rate of water may be determined such that it does not get out of the temperature and pressure range due to evaporation of the water jetted to the ceiling inner wall 21c. That is, it is preferable to determine the targeted flow rate such that the amount of water less than the amount of vapor exhaustible by the vacuum pump is jetted.

More specifically, the controller 61 may pre-store a table including correspondence between the process temperature, the targeted water temperature, the targeted flow rate and the targeted pressure and determine the targeted water temperature, the targeted flow rate and the targeted pressure based on the process temperature read in Step S12 and the table.

After completing Step S17, the controller 61 controls a degree of open of the flow rate control valve 69 based on the targeted flow rate (Step S18).

Next, the controller 61 feedback-controls the operation of the temperature controller 62 based on the targeted water temperature to match the water temperature with the targeted water temperature (Step S19). Next, the controller 61 feedback-controls the operation of the ejector vacuum pump 66 based on the targeted pressure to match the internal pressure of the cavity 21 with the targeted pressure (Step S20).

After completing Step S20 or Step S15, the controller 61 determines whether or not to proceed to the next process (Step S21). If it is determined to proceed to the next process (YES in Step S21), the controller 61 returns the process to Step S12. If it is determined not to proceed to the next process (NO in Step S21), the controller 61 determines whether or not to end the plasma process (Step S22). If it is determined not to end the plasma process (NO in Step S22), the controller 61 returns the process to Step S13. If it is determined to end the plasma process (YES in Step S22), the controller 61 ends the process related to cooling.

In the plasma processing apparatus and the temperature adjustment method according to Embodiment 1, since the wafer mounting table 2 is cooled by vaporization latent heat obtained by evaporating the water jetted to the ceiling inner wall 21c at a low temperature, it is possible to achieve uniform cooling and high responsiveness of the semiconductor wafer W as compared to conventional temperature adjustment methods.

Embodiment 2

Figure 6A:
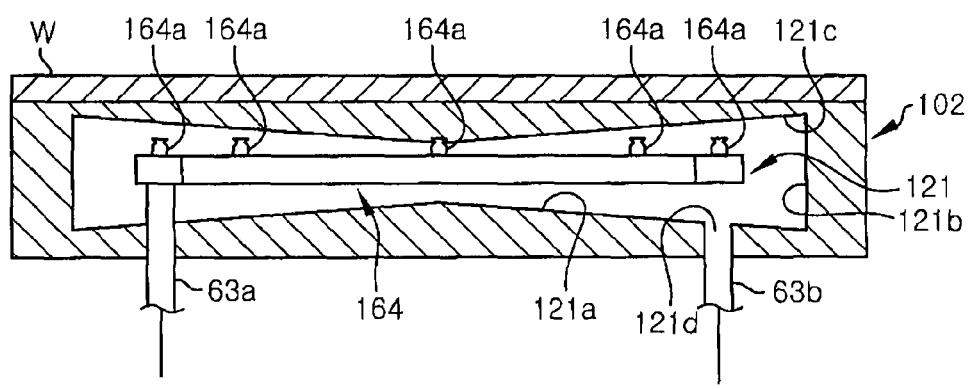
FIG. 6A is a side sectional view of a wafer mounting table and a water jet according to Embodiment 2.
Figure 6B:
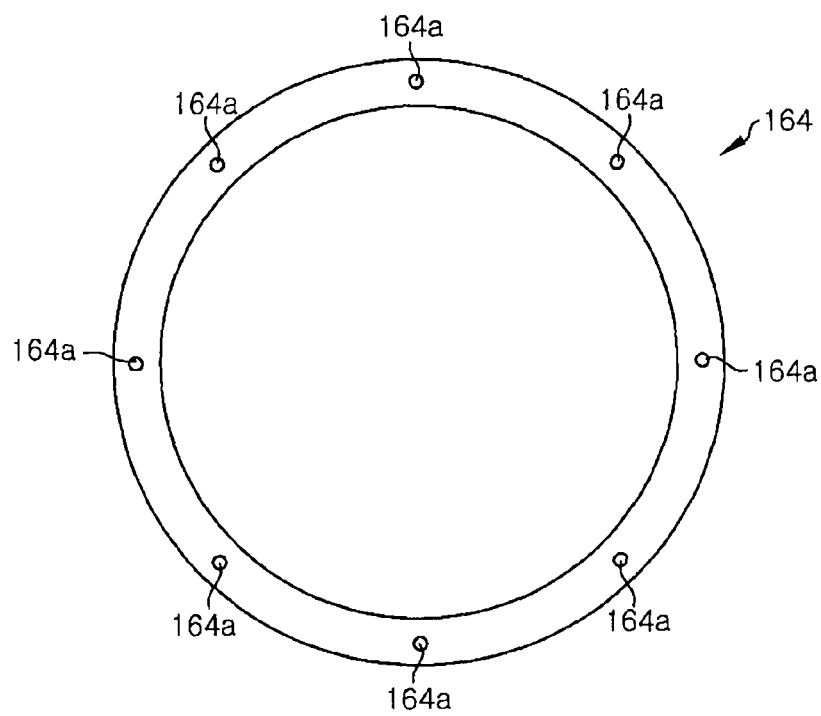
FIG. 6B is a plan view of the water jet according to Embodiment 2.

FIG. 6A is a side sectional view of a wafer mounting table 102 and a water jet 164 according to Embodiment 2 and FIG. 6B is a plan view of the water jet 164 according to Embodiment 2. A semiconductor fabrication apparatus according to Embodiment 2 has the same structure as the semiconductor fabrication apparatus according to Embodiment 1 except a shape of a cavity 121 of the wafer mounting table 102 and a structure of the water jet 164 and therefore a difference therebetween will be mainly described below.

The cavity 121 formed in the wafer mounting table 102 according to Embodiment 2 includes a bottom inner wall 121a, a circumferential wall 121b and a ceiling inner wall 121c. The bottom inner wall 121a and the ceiling inner wall 121c have an inclination surface inclined with respect to a mounting surface on which the semiconductor wafer W is mounted. More specifically, the ceiling inner wall 121c has its apex at the bottom of the central portion of the wafer mounting table 102 in a radial direction and has an inverted conical shape where a skirt portion reaches the circumferential wall 121b. The bottom inner wall 121a has its apex at the top of the central portion of the wafer mounting table 102 in the radial direction and has a conical shape where a skirt portion reaches the circumferential wall 121b. In addition, the bottom inner wall 121a has a discharging hole 121d in the outer side of the radial direction of the wafer mounting table 102, that is, a portion near the circumferential wall 121b, as in Embodiment 1.

The water jet 164 according to Embodiment 2 has a hollow disc shape having a diameter smaller than that of the ceiling inner wall 121c and includes a base communicating to the pipe 63a and a plurality of nozzles 164a distributed circumferentially equidistant on the annular surface of the ceiling inner wall 21c of the base. The water jet 64 is configured to jet the water fed from the temperature controller 62 to the outer circumference of the ceiling inner wall 121c substantially uniformly.

In the semiconductor fabrication apparatus according to Embodiment 2, the water jetted to the ceiling inner wall 121c flows along the inclination surface and the central portion of the wafer mounting table 102. Accordingly, it is possible to keep water for temperature adjustment in the ceiling inner wall 121c extensively for still a long time as compared to Embodiment 1. In addition, if a temperature of the ceiling inner wall 121c is greatly different from the process temperature, although water jetted to the ceiling inner wall 121c causes a phase change instantaneously, there may be a case where the water is adhered to the ceiling inner wall 121c if the temperature of the ceiling inner wall 121c partially reaches the process temperature. When the water flowing along the inclination surface reaches a portion whose temperature does not reach the process temperature, a phase change is caused to cool the corresponding portion.

In this manner, the semiconductor fabrication apparatus according to Embodiment 2 is capable of cooling the semiconductor wafer W more efficiently.

In addition, the water reaching the apex of the ceiling inner wall 121c is dropped on the bottom inner wall 121a and flows along the inclination surface formed in the bottom inner wall 121a toward its outer circumference, unnecessary water which makes no contribution to temperature adjustment can be quickly discharged out of the discharging hole 121d. If a quantity of water stays in the bottom inner wall 121a, there is a fear that the water has an adverse effect on control of the internal pressure of the cavity 121, which may result in incorrect control of the phase change and temperature in the ceiling inner wall 121c. Since Embodiment 2 allows unnecessary water to be quickly discharged, it is possible to perform more correct temperature adjustment of the wafer mounting table 102.

Figure 7A:
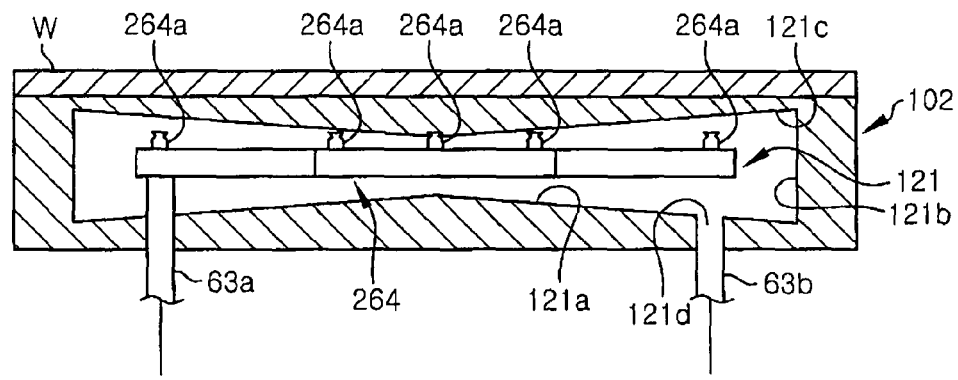
FIG. 7A is a side sectional view of a wafer mounting table and a water jet according to a modification of Embodiment 2.
Figure 7B:
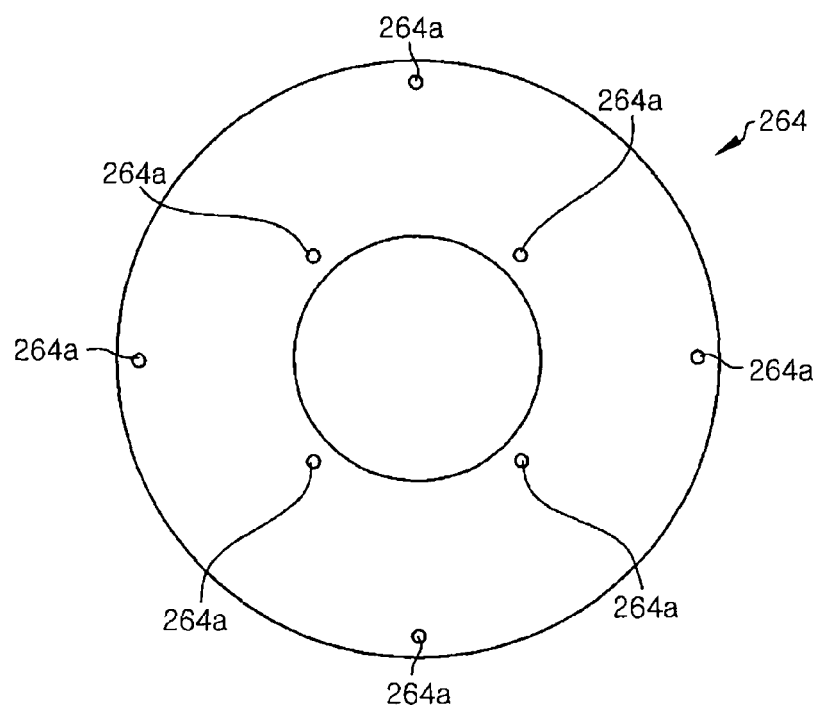
FIG. 7B is a plan view of the water jet according to the modification of Embodiment 2.

FIG. 7A is a side sectional view of the wafer mounting table 102 and a water jet 264 according to a modification of Embodiment 2 and FIG. 7B is a plan view of the water jet 264 according to the modification of Embodiment 2. A semiconductor fabrication apparatus according to the modification of Embodiment 2 has the same structure as the semiconductor fabrication apparatus according to Embodiment 2 except a structure of the water jet 264 and therefore a difference therebetween will be mainly described below. The water jet 264 according to the modification has a hollow disc shape having a diameter smaller than that of the ceiling inner wall 121c and includes a base communicating to the pipe 63a and a plurality of nozzles 264a distributed circumferentially equidistant on outer and inner sides of the annular surface of the base in the side of the ceiling inner wall 121c. The water jet 264 is configured to jet the water fed from the temperature controller 62 to the outer circumference of the ceiling inner wall 121c substantially uniformly.

In the semiconductor fabrication apparatus according to the modification, since the nozzles 264a are distributed in both of the circumferential and radial directions, it is possible to achieve more uniform cooling and higher responsiveness of the semiconductor wafer W.

In addition, it may be preferable to perform a surface treatment to improve wettability of the ceiling inner wall 121c, such as making a surface of the ceiling inner wall 121c porous. In addition, it may be also preferable to add a surfactant in the water to improve wettability. This allows achievement of still more uniformity of temperature adjustment and higher responsiveness.

It is to be understood that Embodiment 2 and the modification thereof may be applied to Embodiments 3 and 4 which will be described below.

Embodiment 3

Figure 8:
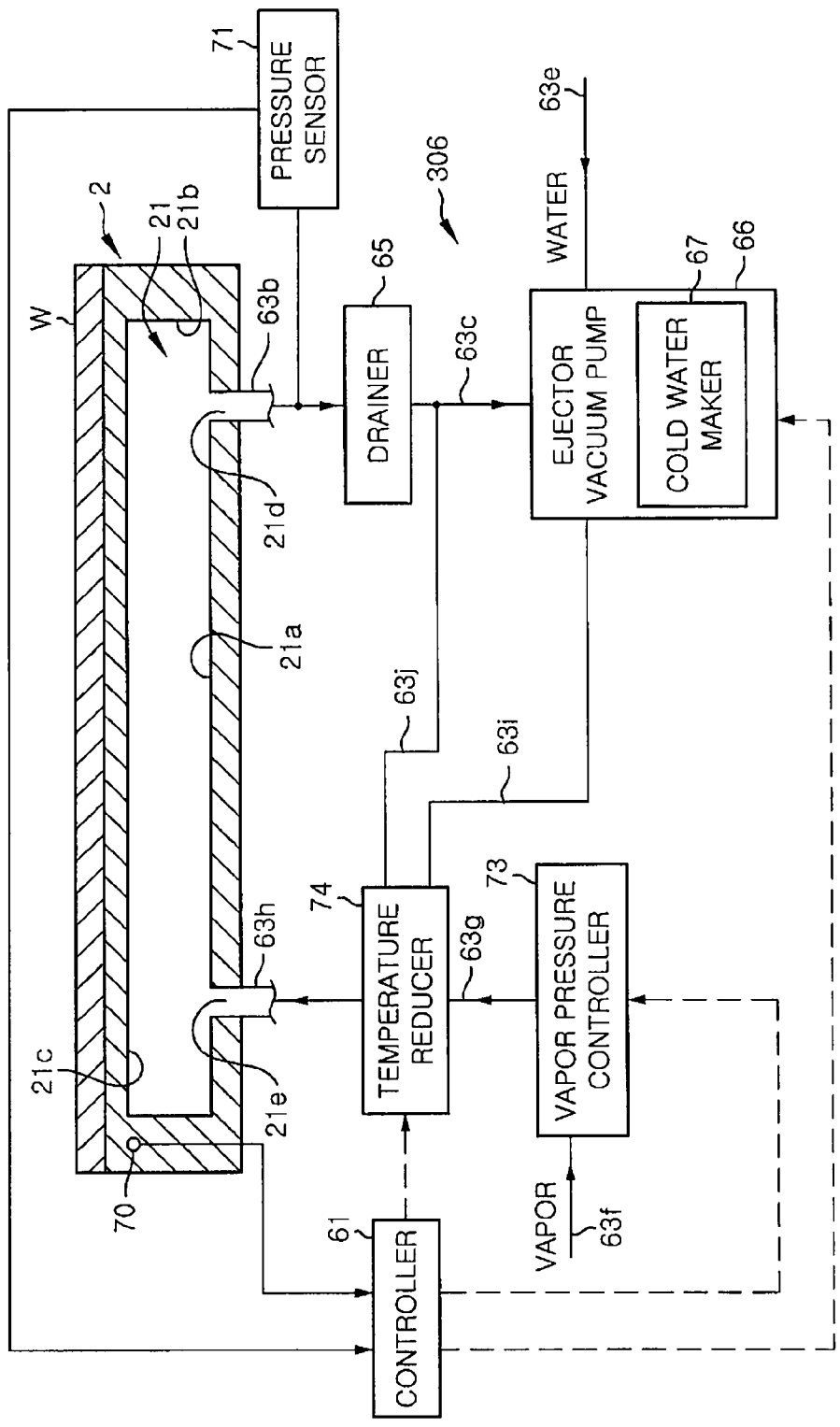
FIG. 8 is a schematic view showing a wafer mounting table and a temperature adjustment device according to Embodiment 3.

FIG. 8 is a schematic view showing the wafer mounting table 2 and a temperature adjustment device 306 according to Embodiment 3. A semiconductor fabrication apparatus according to Embodiment 3 involves adjustment of heating temperature of the wafer mounting table 2 by feeding saturated vapor into the cavity of the wafer mounting table 2. The semiconductor fabrication apparatus according to Embodiment 3 has the same structure as Embodiment 1 except a structure of the wafer mounting table 2 and the temperature adjustment device 306 and therefore a difference therebetween will be mainly described below.

The temperature adjustment device 306 according to Embodiment 3 includes a vapor pressure controller 73 for feeding saturated vapor into the cavity 21 and a temperature reducer 74 instead of the water jet 64, the temperature controller 62 and the flow rate sensor 72 described in Embodiment 1. In addition, a vapor feeding hole (temperature adjustment medium feeding hole) 21e is provided at an appropriate place of the wafer mounting table 2.

The vapor pressure controller 73 is configured as a reducing valve which receives saturated vapor from the outside via a pipe 63f, reduces the received saturated vapor to a pressure at which temperature can be controlled by the next stage temperature reducer 74, and delivers the decompressed vapor to the temperature reducer 74 via a pipe 63g. In addition, the vapor pressure controller 73 includes a vapor feeding valve (not shown) to open/close between the pipes 63f and 63g.

The temperature reducer 74 controls temperature of the vapor by changing the pressure of the vapor delivered from the vapor pressure controller 73 according to a control signal from the controller 61, and feeds the saturated vapor with the controlled temperature into the cavity 21 via a pipe 63h. The ejector vacuum pump 66 is configured to circulate cold water for pressure control from the cold water maker 67 via pipes 63i and 63j.

Figure 9A:
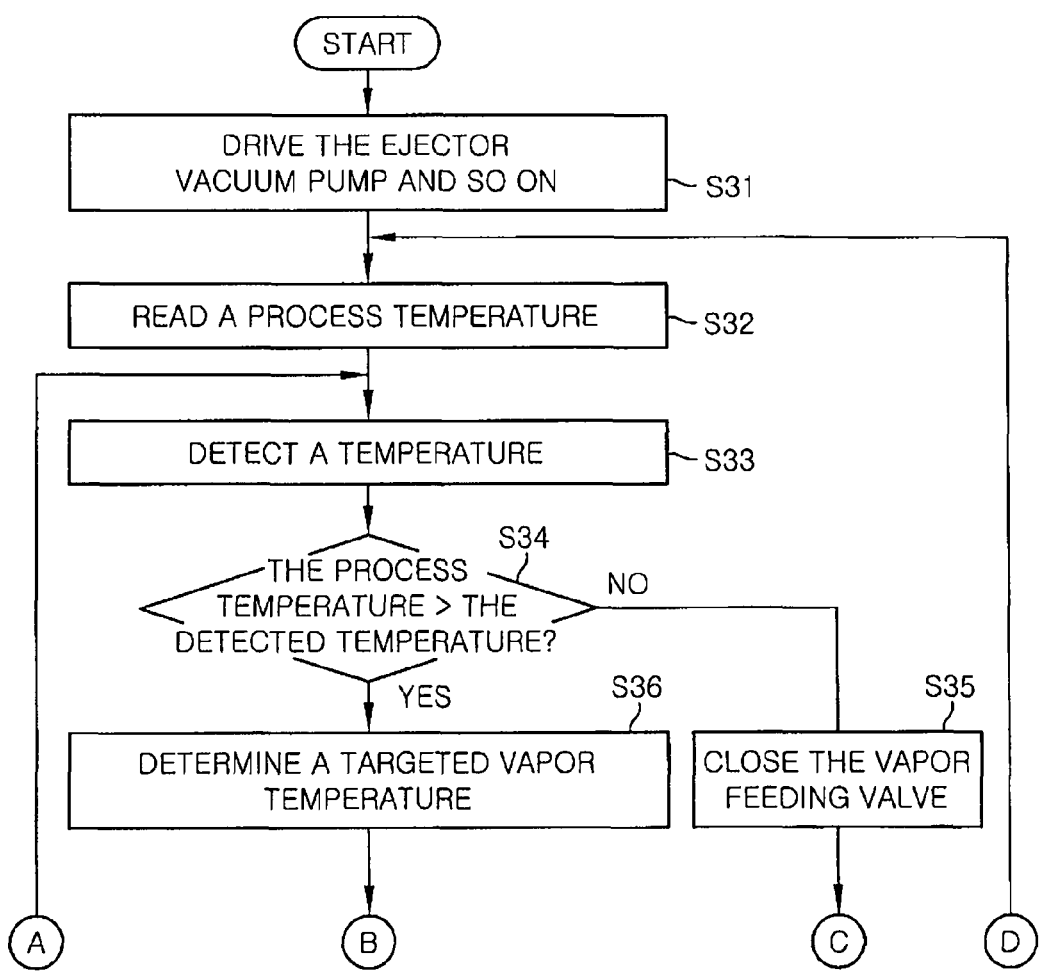
FIGS. 9A and 9B are a flow chart showing a process of a controller related to heating.
Figure 9B:
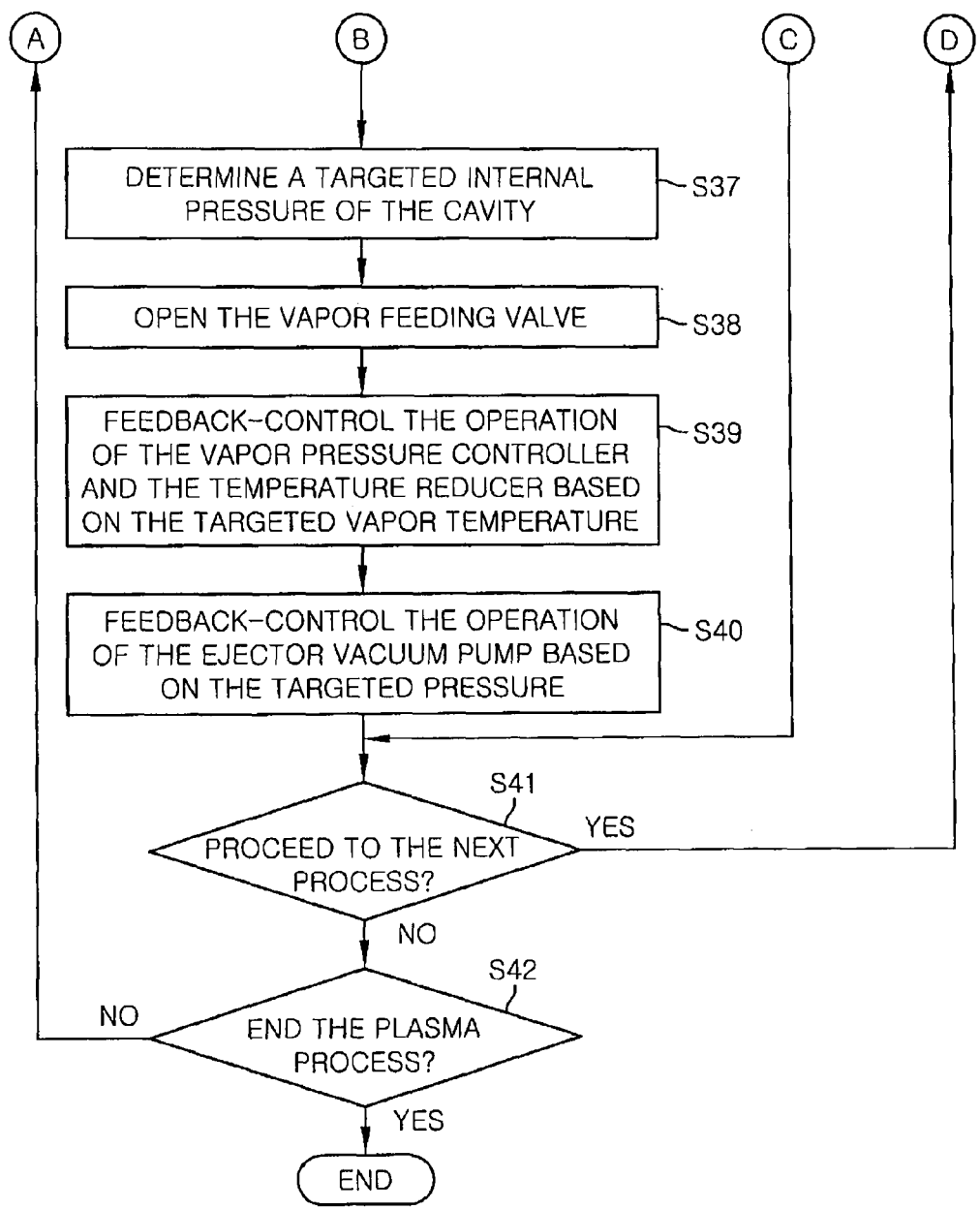

FIGS. 9A and 9B are a flow chart showing a process of the controller 61 related to heating. The controller 61 drives the ejector vacuum pump 66 and so on (Step S31). Then, the controller 61 reads process temperature from the storage (not shown) (Step S32). Next, the controller 61 detects a temperature from the temperature sensor 70 (Step S33).

Then, the controller 61 determines whether or not the detected temperature is less than the process temperature (Step S34). If the detected temperature is equal to or more than the process temperature (NO in Step S34), the controller 61 controls the vapor feeding valve to be closed (Step S35).

If it is determined that the detected temperature is less than the process temperature (YES in Step S34), the controller 61 determines a targeted vapor temperature which is a temperature of saturated vapor to be fed into the cavity 21 (Step S36) and determines a targeted internal pressure of the cavity 21 (Step S37). The targeted vapor temperature and the targeted internal pressure will be described below.

Figure 10:
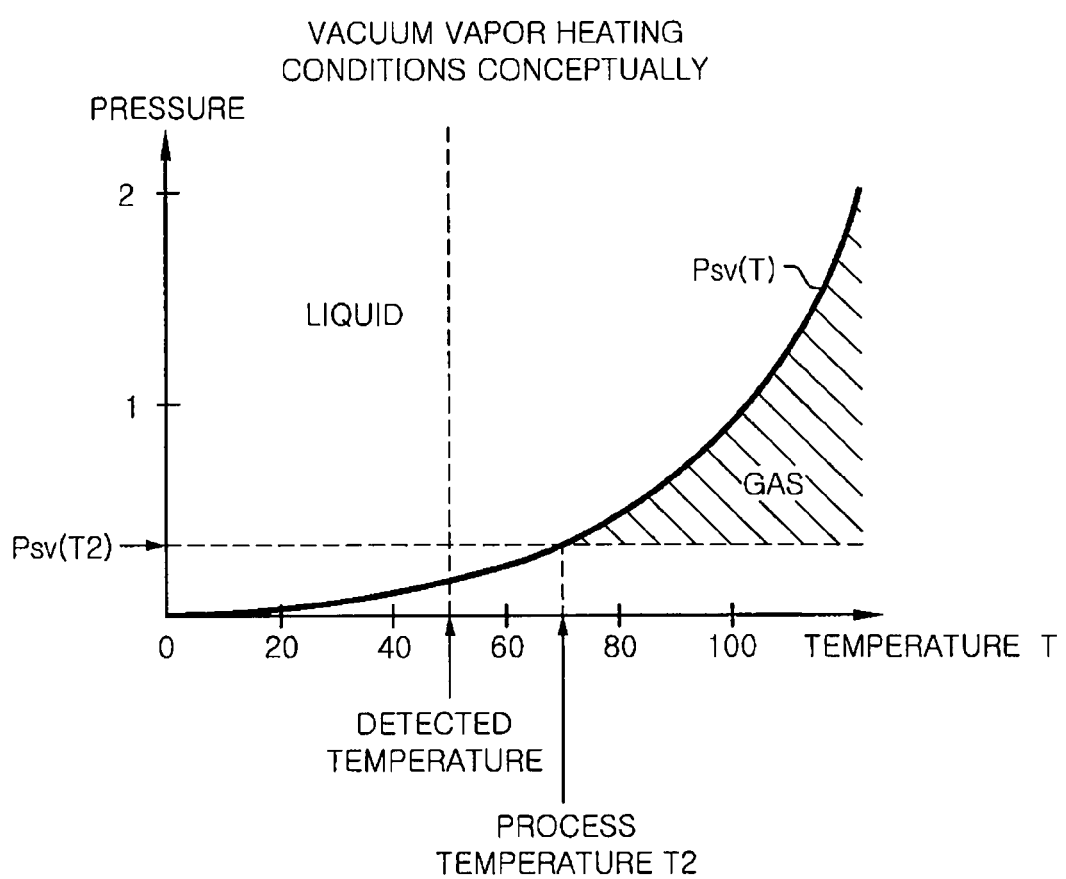
FIG. 10 is a state diagram showing vacuum vapor heating conditions conceptually.

FIG. 10 is a state diagram showing vacuum vapor heating conditions conceptually. The state diagram shown in FIG. 10 is similar to the state diagram shown in FIG. 5. If the detected temperature is less than the process temperature T2, the controller 61 determines the targeted vapor temperature and the targeted pressure within a range of temperature and pressure, which is indicated by oblique lines. The internal pressure of the cavity 21 within the temperature and pressure range indicated by oblique lines corresponds to equal to or more than the saturated vapor pressure Psv(T2) with respect to the process temperature T2 and equal to or less than the saturated vapor pressure P with respect to the temperature T of the vapor fed into the cavity 21. For example, the same temperature as the process temperature T2 may be set to the targeted vapor temperature and the saturated vapor pressure Psv(T2) with respect to the process temperature T2 may be set to the targeted pressure.

More specifically, the controller 61 may pre-store a table including correspondence between the process temperature, the targeted vapor temperature and the targeted pressure and determine the targeted vapor temperature and the targeted pressure based on the process temperature read in Step S32 and the table.

After completing Step S37, the controller 61 controls the vapor feeding valve to be opened (Step S38). Next, the controller 61 feedback-controls the operation of the vapor pressure controller 73 and the temperature reducer 74 based on the targeted vapor temperature to match the vapor temperature with the targeted vapor temperature (Step S39). Next, the controller 61 feedback-controls the operation of the ejector vacuum pump 66 based on the targeted pressure to match the internal pressure of the cavity 21 with the targeted pressure (Step S40).

A process after Step S40 or Step S35, that is, a process in Step S41 and Step S42, is similar to the process in Step S21 and Step S22 described in Embodiment 1, and therefore detailed explanation thereof will not be repeated.

In the semiconductor fabrication apparatus and the temperature adjustment method according to Embodiment 3, since the wafer mounting table 2 is heated by condensation latent heat obtained when low temperature vapor fed into the cavity 21 is condensed into liquid, it is possible to achieve uniform heating and high responsiveness of the semiconductor wafer W as compared to conventional temperature adjustment methods.

Embodiment 4

Figure 11:
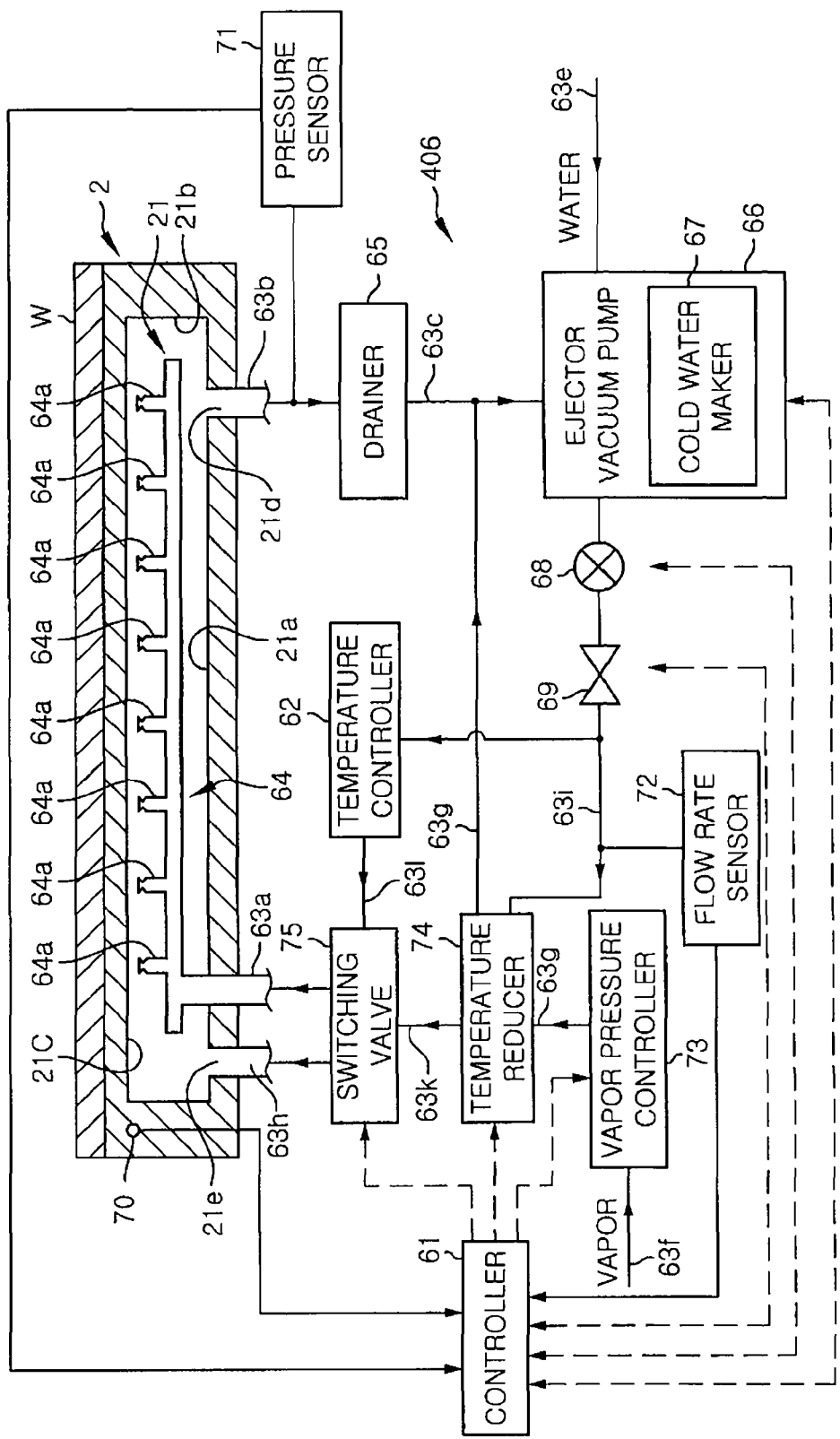
FIG. 11 is a schematic view showing a wafer mounting table and a temperature adjustment device according to Embodiment 4.
Figure 12A:
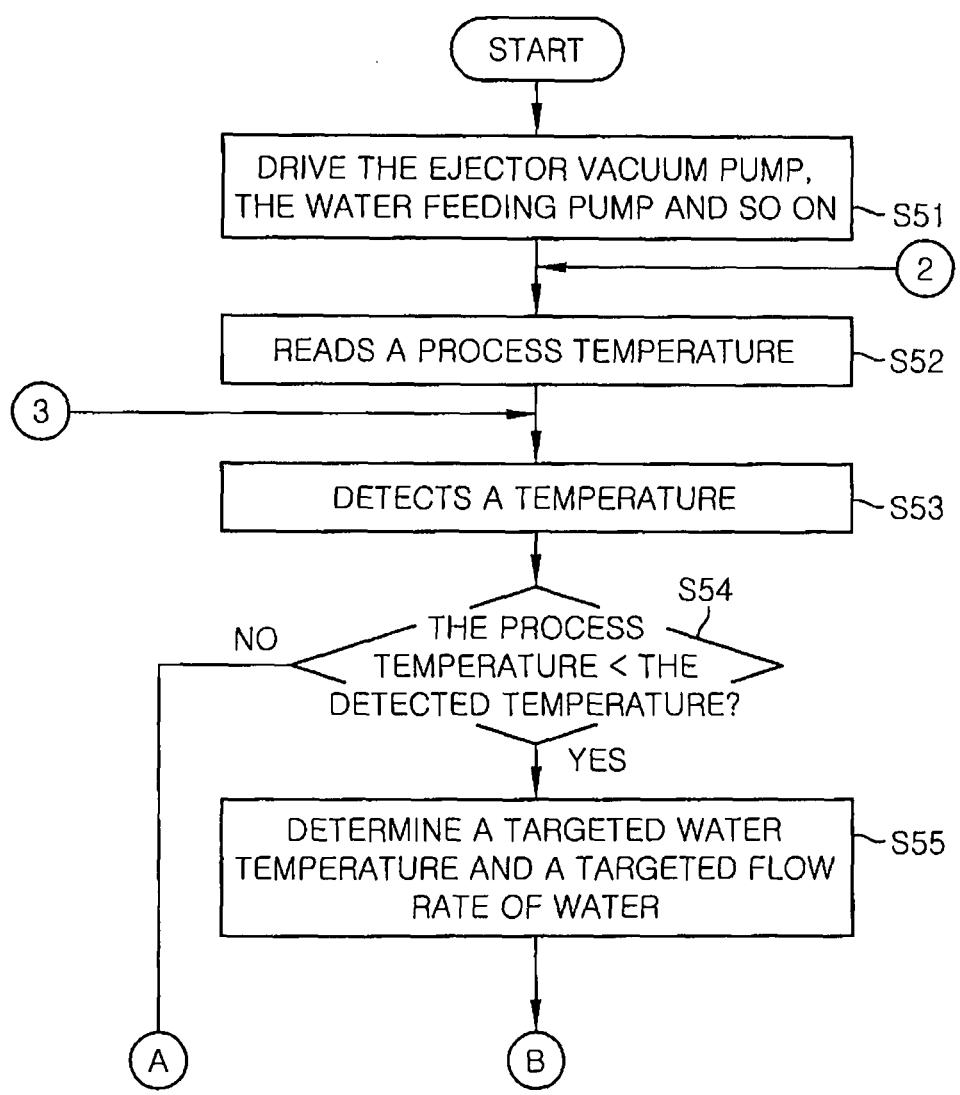
FIGS. 12A and 12B are a flow chart showing a process of a controller related to heating/cooling.
Figure 12B:
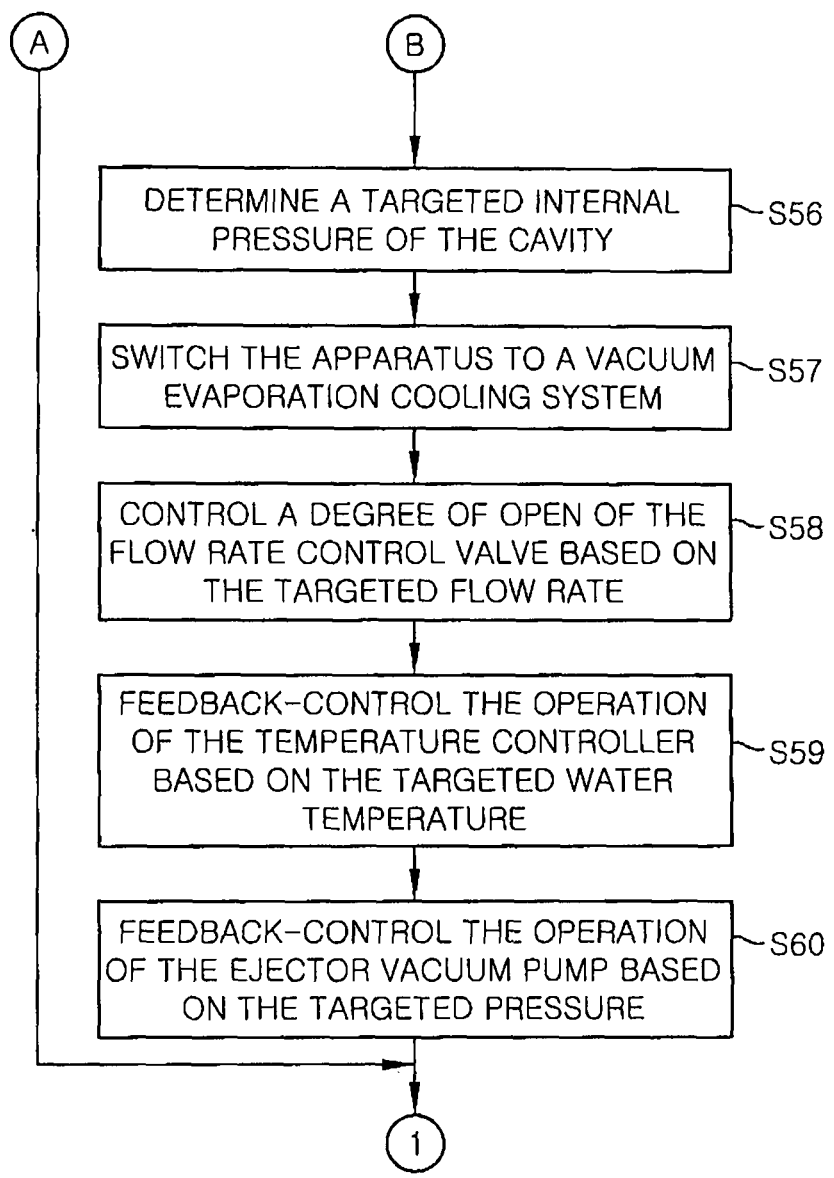
Figure 13A:
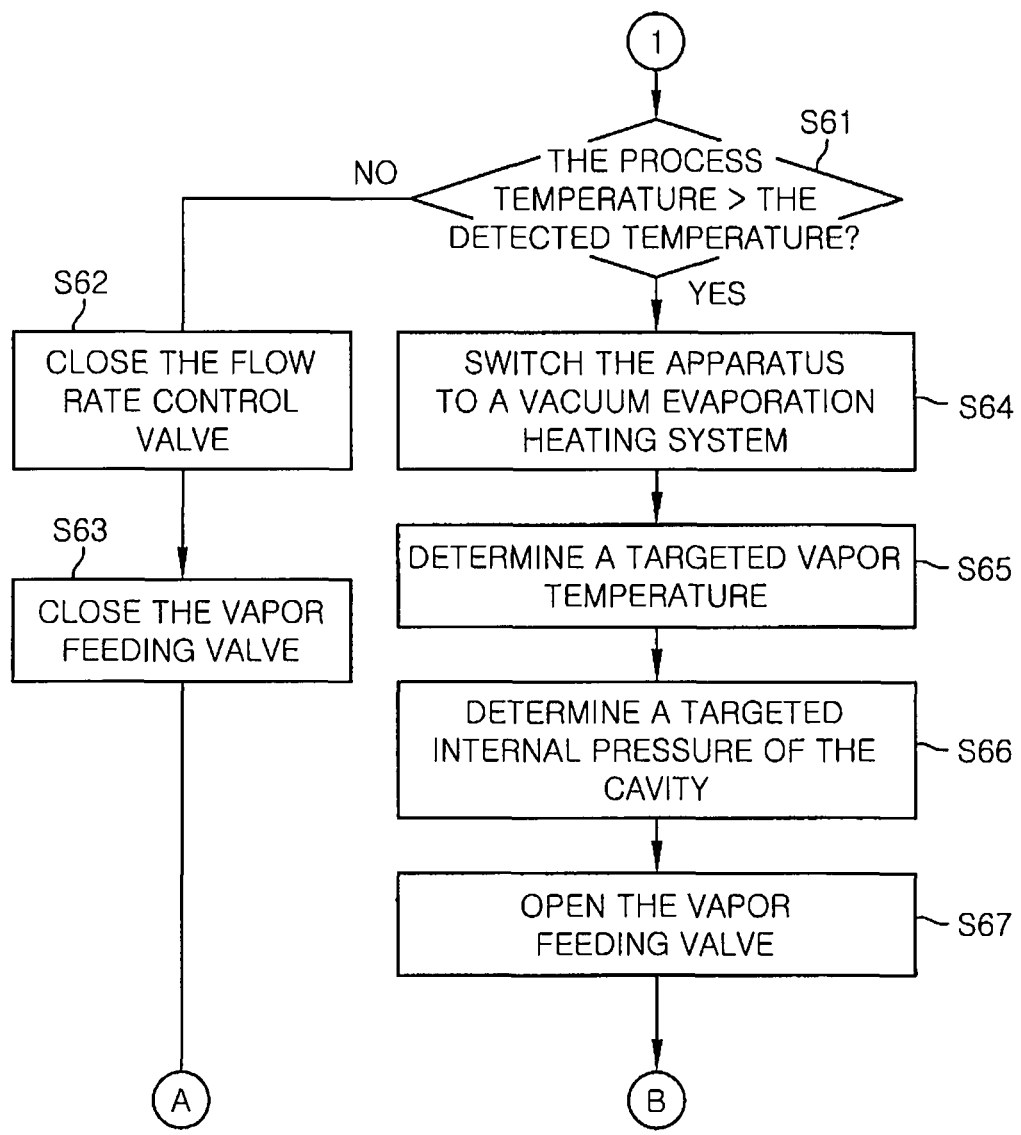
FIGS. 13A and 13B are a flow chart showing a process of a controller related to heating/cooling.
Figure 13B:
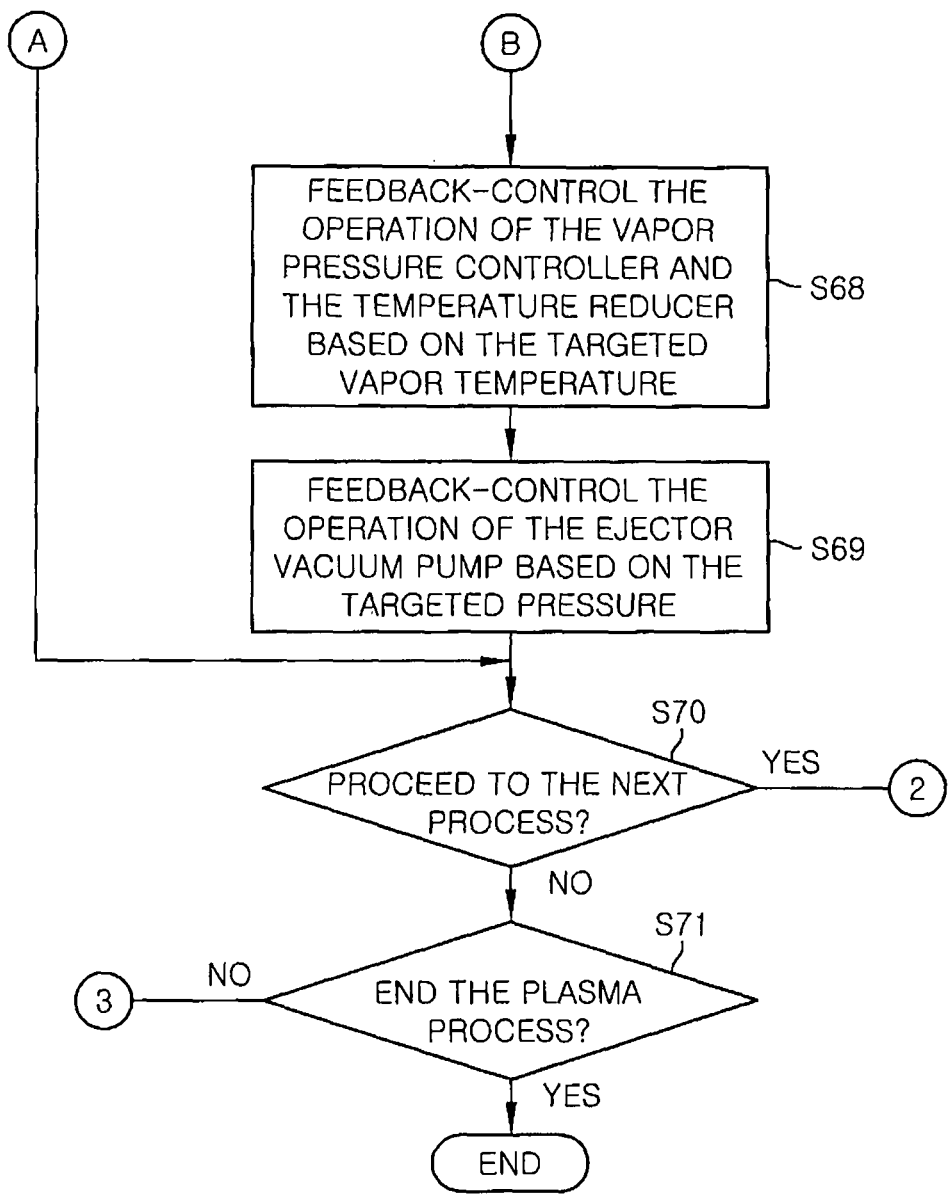

FIG. 11 is a schematic view showing a wafer mounting table 2 and a temperature adjustment device 406 according to Embodiment 4. A semiconductor fabrication apparatus according to Embodiment 4 is configured to cool and heat the wafer mounting table 2 by a combination of elements of Embodiments 1 and 3.

The wafer mounting table 2 according to Embodiment 4 contains the cavity 21 where the water jet 64 is arranged, as in Embodiment 1. In addition, it has the vapor feeding hole 21e formed in an appropriate place of the bottom inner wall 21a, as in Embodiment 3.

The temperature adjustment device 406 according to Embodiment 4 includes the controller 61, the temperature controller 62, the water jet 64, the drainer 65, the ejector vacuum pump 66, the cold water maker 67, the water feeding pump 68, the flow rate control valve 69, the temperature sensor 70, the pressure sensor 71 and the flow rate sensor 72, as in Embodiment 1. In addition, the temperature adjustment device 406 has the vapor pressure controller 73 and the temperature reducer 74, as in Embodiment 3.

In addition, the temperature adjustment device 406 further includes a switching valve 75 for switching between heating and cooling. The switching valve 75 is connected with pipes 63k, 63l, 63h and 63a and comprises a valve for selectively switching between a path along which the vapor delivered from the temperature reducer 74 is delivered to the vapor feeding hole 21e and a path along which the water delivered from the temperature controller 62 is delivered to the water jet 64. The switching of path by the switching valve 75 is performed according to a control signal from the controller 61.

FIGS. 12A, 12B, 13A and 13B are flow charts showing a process of the controller 61 related to heating/cooling. The controller 61 drives the ejector vacuum pump 66, the water feeding pump 68 and so on (Step S51). Then, the controller 61 reads process temperature from the storage (not shown) (Step S52). Next, the controller 61 detects a temperature from the temperature sensor 70 (Step S53).

Then, the controller 61 determines whether or not the temperature detected from the temperature sensor 70 exceeds the process temperature (Step S54). If it is determined that the detected temperature exceeds the process temperature (YES in Step S54), the controller 61 determines a targeted water temperature and a targeted flow rate of water to be jetted to the ceiling inner wall 21c (Step S55) and determines a targeted internal pressure of the cavity 21 (Step S56).

After completing Step S56, the controller 61 switches the apparatus to a vacuum evaporation cooling system by means of a switcher (Step S57). Then, the controller 61 controls a degree of open of the flow rate control valve 69 based on the targeted flow rate (Step S58). Next, the controller 61 feedback-controls the operation of the temperature controller 62 based on the targeted water temperature to match the water temperature with the targeted water temperature (Step S59). Next, the controller 61 feedback-controls the operation of the ejector vacuum pump based on the targeted pressure to match the internal pressure of the cavity 21 with the targeted pressure (Step S60).

After completing Step S60 or if the detected temperature is equal to or less than the process temperature (NO in Step S54), the controller 61 determines whether or not the detected temperature is less than the process temperature (Step S61). If the detected temperature is not less than the process temperature (NO in Step S61), the controller 61 controls the flow rate control valve 69 to be closed (Step S62) and controls the vapor feeding valve to be closed (Step S63).

If it is determined in Step S61 that the detected temperature is less than the process temperature (YES in Step S61), the controller 61 switches the apparatus to a vacuum evaporation heating system by means of the switcher (Step S64). Then, the controller 61 determines a targeted vapor temperature which is a temperature of saturated vapor to be fed into the cavity 21 (Step S65) and determines a targeted internal pressure of the cavity 21 (Step S66).

After completing Step S66, the controller 61 controls the vapor feeding valve to be opened (Step S67). Next, the controller 61 feedback-controls the operation of the vapor pressure controller 73 and the temperature reducer 74 based on the targeted vapor temperature to match the vapor temperature with the targeted vapor temperature (Step S68). Next, the controller 61 feedback-controls the operation of the ejector vacuum pump 66 based on the targeted pressure to match the internal pressure of the cavity 21 with the targeted pressure (Step S69).

After completing Step S69 or Step S63, the controller 61 determines whether or not to proceed to the next process (Step S70). If it is determined to proceed to the next process (YES in Step S70), the controller 61 returns the process to Step S52.

If it is determined not to proceed to the next process (NO in Step S70), the controller 61 determines whether or not to end the plasma process (Step S71). If it is determined not to end the plasma process (NO in Step S71), the controller 61 returns the process to Step S53. If it is determined to end the plasma process (YES in Step S71), the controller 61 ends the process related to heating/cooling.

In the semiconductor fabrication apparatus and the temperature adjustment method according to Embodiment 4, it is possible to achieve uniform heating/cooling and high responsiveness of the semiconductor wafer W as compared to conventional temperature adjustment methods.

Although the temperature adjustment medium has been illustrated with water in the above embodiments, it should be understood that the temperature adjustment medium is not limited to water.

Next, an experiment of adjusting heating temperature of the wafer mounting table 2 by feeding saturated vapor into the cavity 21 of the wafer mounting table 2 in order to confirm operation and effects of the semiconductor fabrication apparatus and the temperature adjustment method of the present invention will be described.

Figure 14:
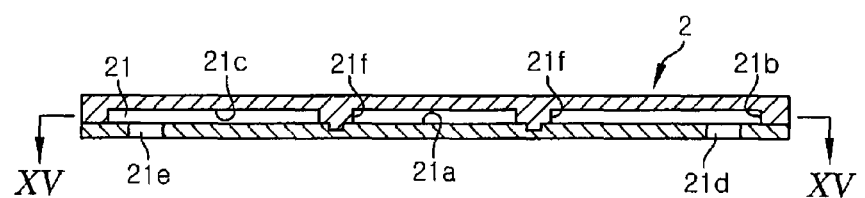
FIG. 14 is a side sectional view of a wafer mounting table used in an experiment.
Figure 15:
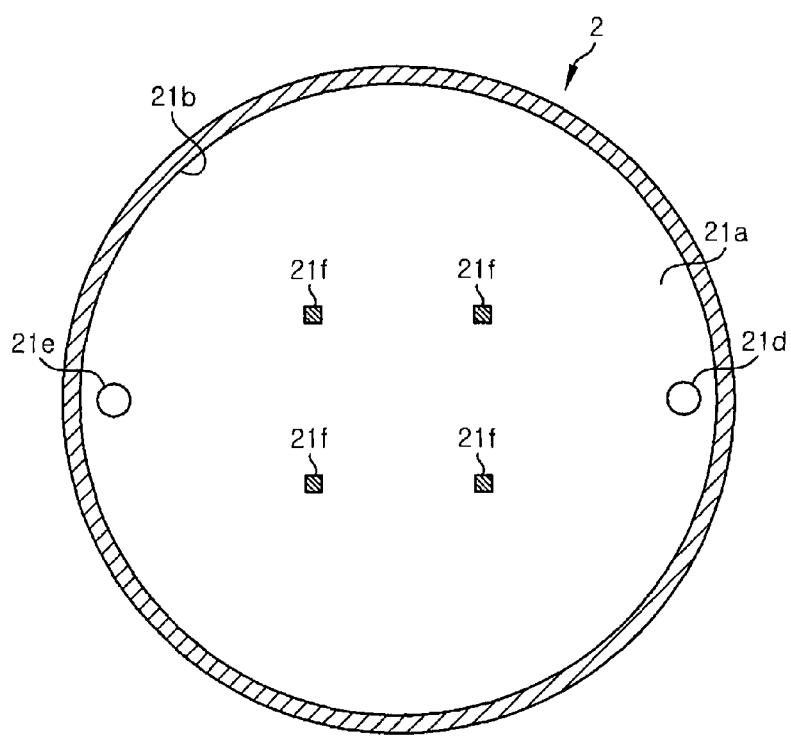
FIG. 15 is a sectional view taken along line XV-XV in the wafer mounting table.

FIG. 14 is a side sectional view of the wafer mounting table 2 used in an experiment and FIG. 15 is a sectional view taken along line XV-XV in the wafer mounting table 2. The wafer mounting table 2 has a cavity 21 having a circular bottom inner wall 21a, a circumferential wall 21b and a circular ceiling inner wall 21c which are integrated, as in Embodiment 3. The wafer mounting table 2 is made of aluminum. The wafer mounting table 2 has a diameter of 480 mm and a total thickness of 33 mm and the bottom inner wall 21a and the ceiling inner wall 21c have a thickness of about 10 mm. The bottom inner wall 21a of the wafer mounting table 2 is formed with a vapor feeding hole 21e and a discharging hole 21d for discharging gas and water within the cavity 21. The vapor feeding hole 21e and a discharging hole 21d are provided at a place apart by 200 mm from the center of the bottom inner wall 21a in a radial direction in such a manner that they have a symmetrical relationship with respect to the center of the bottom inner wall 21a. In addition, four supports 21f are provided around the center of the bottom inner wall 21a in the cavity 21 of the wafer mounting table 2 in order to prevent the wafer mounting table 2 from being collapsed due to vacuum exhaustion. Each support 21f has a prismatic shape having a length of one side of 15 mm and is positioned at an apex of a square having a length of one side of 135 mm.

Figure 16:
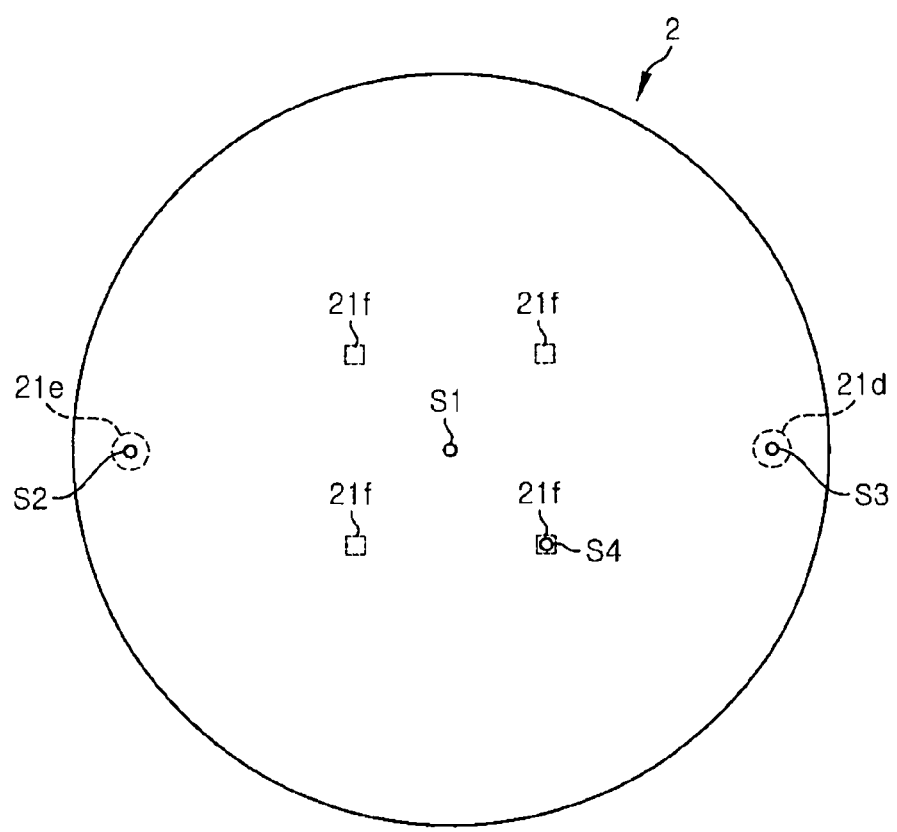
FIG. 16 is a plan view showing a wafer mounting table provided with temperature sensors.

FIG. 16 is a plan view showing the wafer mounting table 2 provided with temperature sensors S1 to S4. Specifically, in order to confirm temperature uniformity and temperature increase follow-ability of the wafer mounting table 2 when heating temperature adjustment is performed, a temperature sensor S1 is provided at the top of the wafer mounting table 2, that is, a place corresponding to the center of the bottom inner wall 21c in the radial direction, a temperature sensor S2 is provided at a place corresponding to the vapor feeding hole 21e, a temperature sensor S3 is provided at a place corresponding to the discharging hole 21d and a temperature sensor S4 is provided at a place corresponding to the supports 21f.

First, temperature of saturated vapor fed into the cavity 21 of the wafer mounting table 2 was increased from 40° C. to 100° C. with an interval of 10° C. step by step and a temporal change in a temperature difference ΔT between maximum temperature and minimum temperature detected by the temperature sensors S1 to S4 was examined.

Figure 17:
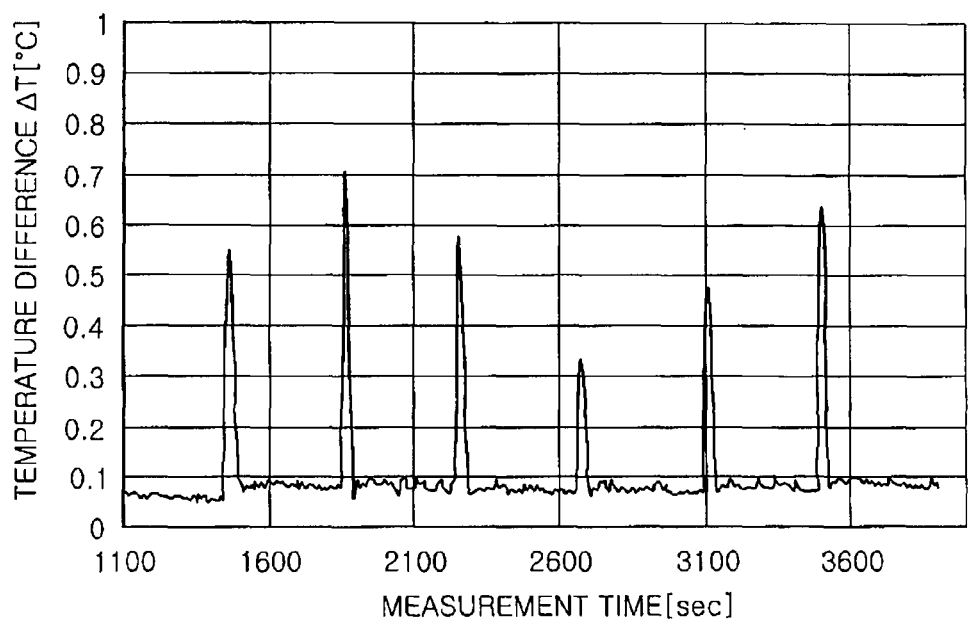
FIG. 17 is a graph of a result of an experiment showing temperature uniformity of a wafer mounting table when heating temperature adjustment is performed.

FIG. 17 is a graph of a result of an experiment showing temperature uniformity of the wafer mounting table 2 when heating temperature adjustment is performed. In the graph, a horizontal axis represents measurement time and a vertical axis represents a temperature difference ΔT between maximum temperature and minimum temperature of the wafer mounting table 2. From the graph shown in FIG. 17, it can be seen that temperature is controlled so that the temperature difference ΔT is less than 1.0° C. in temperature increase and the temperature difference ΔT is less than 0.1° C. in normality.

Next, the temperature of saturated vapor fed into the cavity 21 of the wafer mounting table 2 was suddenly increased from 40° C. to 100° C. at a speed of about 1° C. and a temporal change in a temperature difference ΔT between maximum temperature and minimum temperature detected by the temperature sensors S1 to S4 was examined.

Figure 18:
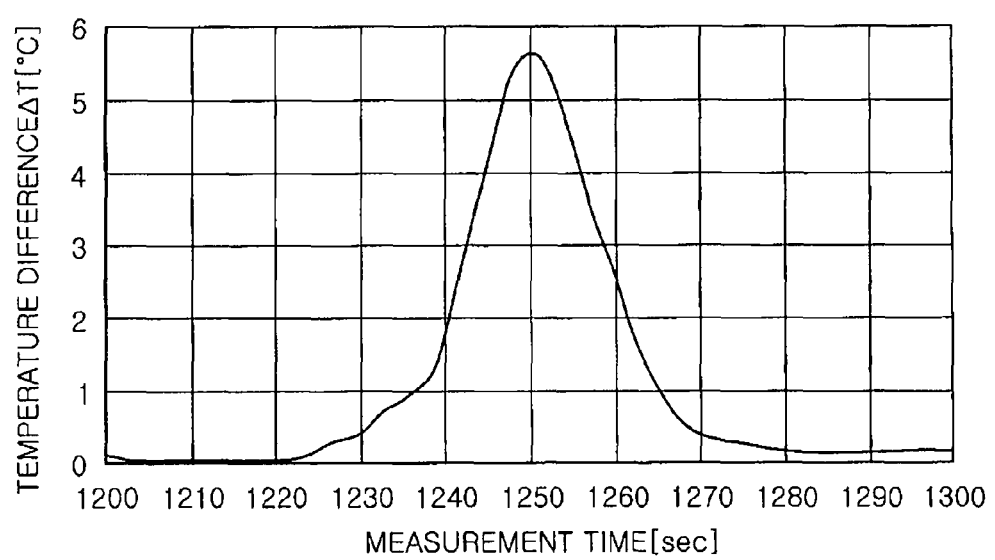
FIG. 18 is a graph of a result of an experiment showing temperature uniformity and temperature increase followability of a wafer mounting table when heating temperature adjustment is performed.

FIG. 18 is a graph of a result of an experiment showing temperature uniformity and temperature increase followability of the wafer mounting table 2 when heating temperature adjustment is performed. In the graph, a horizontal axis represents measurement time and a vertical axis represents a temperature difference ΔT between maximum temperature and minimum temperature of the wafer mounting table 2. From the graph shown in FIG. 18, it can be seen that the temperature difference ΔT is limited to be less than 5.5° C. even when the temperature of the wafer mounting table 2 is suddenly increased at the speed of about 1° C.

From the above results of experiments, it was confirmed that the semiconductor fabrication apparatus and the temperature adjustment method of the present invention could achieve high temperature uniformity (ΔT<5.5° C. in temperature increase and ΔT<0.1° C. in normality) and temperature increase follow-ability in either temperature increase or normality.

Embodiment 5

Figure 19:
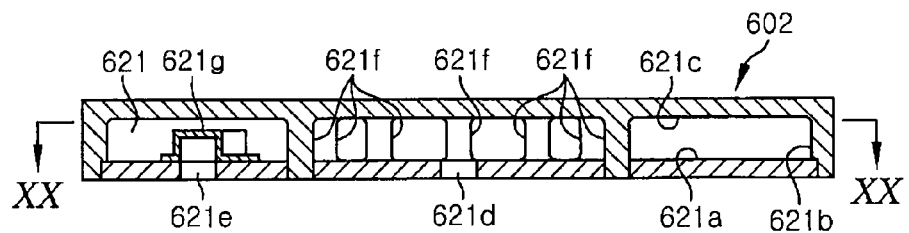
FIG. 19 is a side sectional view of a wafer mounting table constituting a semiconductor fabrication apparatus according to Embodiment 5.
Figure 20:
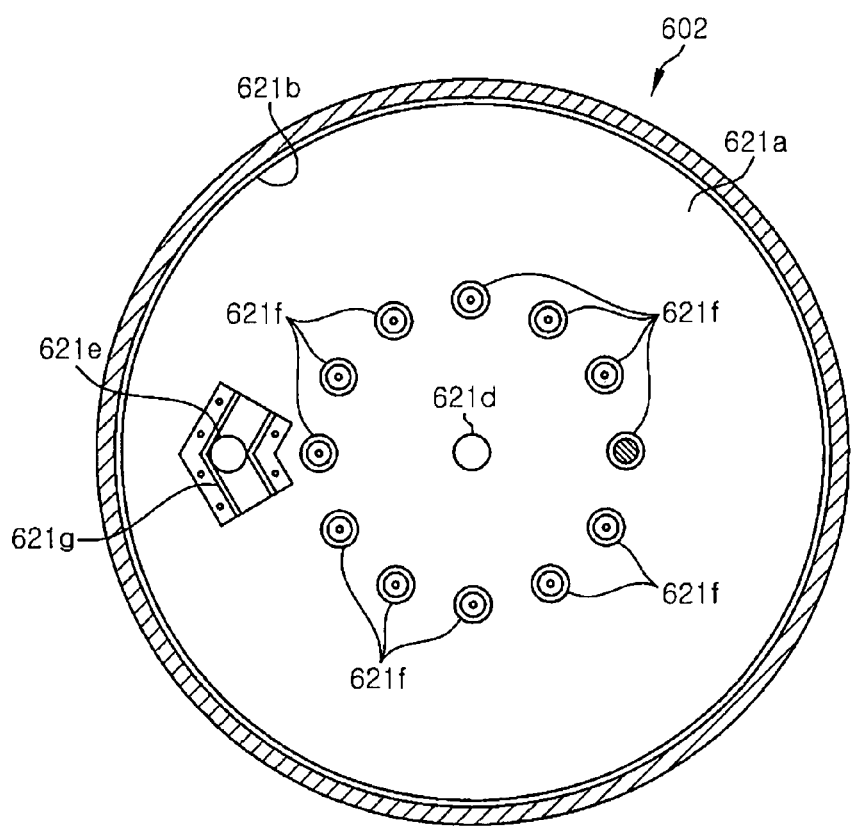
FIG. 20 is a sectional view taken along line XX-XX in FIG. 19.

FIG. 19 is a side sectional view of a wafer mounting table 602 constituting a semiconductor fabrication apparatus according to Embodiment 5 and FIG. 20 is a sectional view taken along line XX-XX of FIG. 19. The wafer mounting table 602 has a cavity 621 having a circular bottom inner wall 621a, a circumferential wall 621b and a circular ceiling inner wall 621c which are integrated. The wafer mounting table 602 has a diameter of 480 mm and a total thickness of 50 mm, a width in a height direction within the cavity 621 is 30 mm and the bottom inner wall 621a and the ceiling inner wall 621c have a thickness of about 10 mm. A vapor feeding hole 621e is provided at a place apart by 200 mm from the center of the bottom inner wall 21a in a radial direction. The vapor feeding hole 621e is provided with a branch nozzle 621g which has substantially a V-like shape when viewed from the top and branches saturated vapor introduced into the cavity 621 in a circumferential direction of the wafer mounting table 602. More specifically, the branch nozzle includes a first tube which guides the saturated vapor introduced into the cavity 621 in a first circumferential direction while preventing the saturated vapor from making direct contact with the ceiling inner wall 621c, and a second tube which is continued to the first tube and guides the saturated vapor introduced into the cavity 621 in a second circumferential direction which is reverse to the first circumferential direction. In addition, in the center of the bottom inner wall 621a of the wafer mounting table 2 is formed a discharging hole 621d for discharging gas and water within the cavity 621. In addition, supports 621f are provided around the center of the bottom inner wall 621a in the cavity 621 of the wafer mounting table 602 in order to prevent the wafer mounting table 602 from being collapsed due to vacuum exhaustion. Each support 621f has a cylindrical shape.

Figure 21:
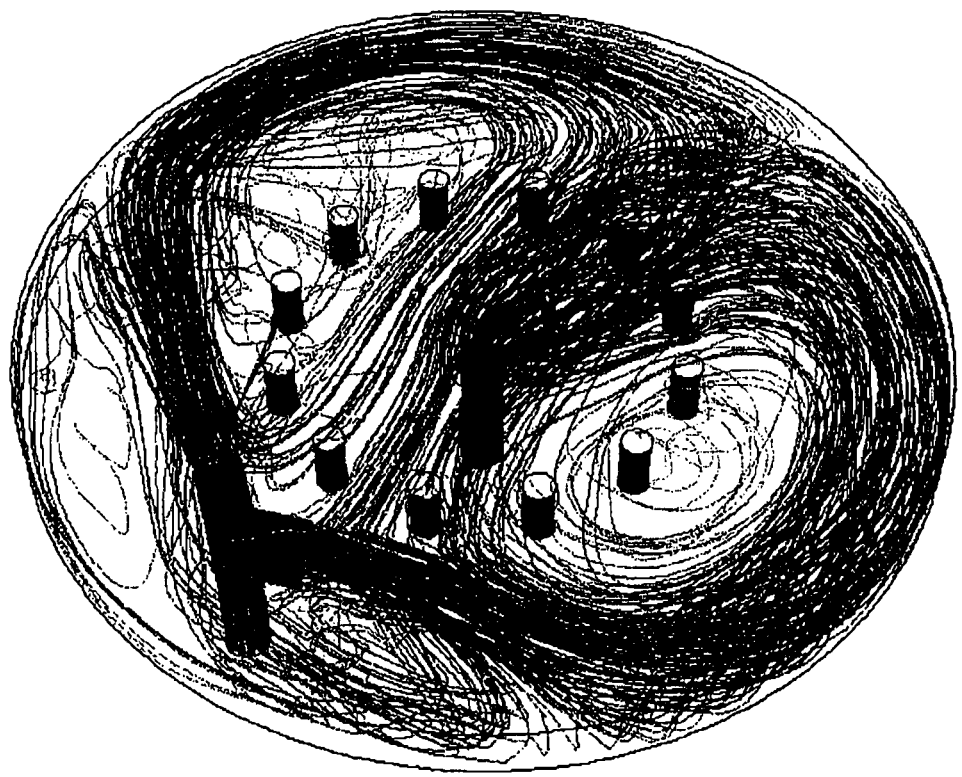
FIG. 21 is an explanatory view showing a result of simulation on a flow of saturated vapor.

FIG. 21 is an explanatory view showing a result of simulation on a flow of saturated vapor. As shown in FIG. 21, in the semiconductor fabrication apparatus according to Embodiment 5, saturated vapor introduced into the cavity 621 is branched within the cavity 621 in the circumferential direction of the wafer mounting table 602 and is discharged out of the discharging hole 621d. This allows avoidance of local heating of the wafer mounting table 602 and improvement of temperature uniformity as compared to the configuration where the saturated vapor introduced into the cavity 621 makes direct contact with the ceiling inner wall 621c.

Although the branching of the saturated vapor introduced into the cavity 621 has been illustrated in Embodiment 5, it is possible to improve temperature uniformity of the wafer mounting table 602 if a guide plate which guides the saturated vapor fed into the cavity 621 to a direction along the ceiling inner wall 621c is provided.

Next, an experiment of adjusting heating temperature of the wafer mounting table 602 by feeding saturated vapor into the cavity 621 of the wafer mounting table 602 in order to confirm operation and effects of the semiconductor fabrication apparatus and the temperature adjustment method according to Embodiment 5 will be described.

Figure 22:
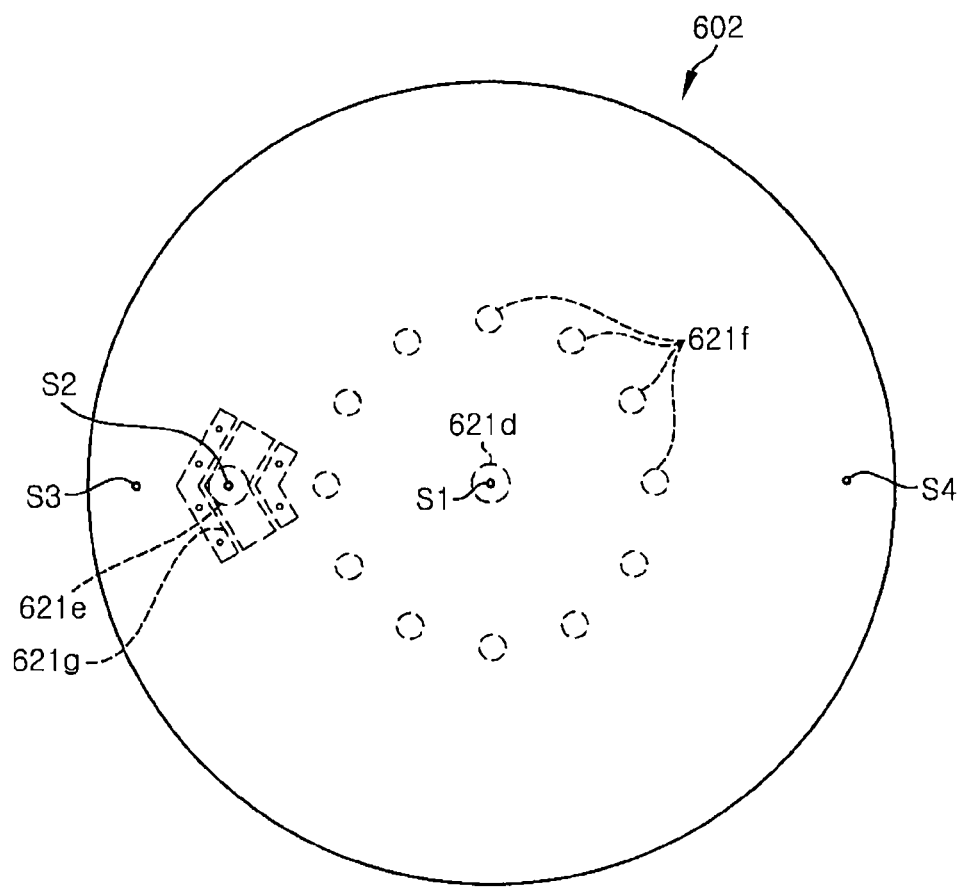
FIG. 22 is a plan view showing a wafer mounting table provided with a temperature sensor.

FIG. 22 is a plan view showing the wafer mounting table 602 provided with temperature sensors S1 to S4. Specifically, in order to confirm temperature uniformity and temperature increase follow-ability of the wafer mounting table 602 when heating temperature adjustment is performed, a temperature sensor S1 is provided at a surface of the wafer mounting table 602, that is, a place corresponding to the center of the bottom inner wall 621c in the radial direction, a temperature sensor S2 is provided at a place corresponding to the vapor feeding hole 621e, a temperature sensor S3 is provided at a place corresponding to an outer side farther than the vapor feeding hole 621e in the radial direction and a temperature sensor S4 is provided at a place corresponding to a place symmetrical to the temperature sensor S3 with respect to the center of the wafer mounting table 602.

Here, temperature of saturated vapor fed into the cavity 621 of the wafer mounting table 602 was suddenly increased from 40° C. to 100° C. at a rate of about 1° C./sec and a temporal change in a temperature difference ΔT between maximum temperature and minimum temperature detected by the temperature sensors S1 to S4 was examined.

Figure 23:
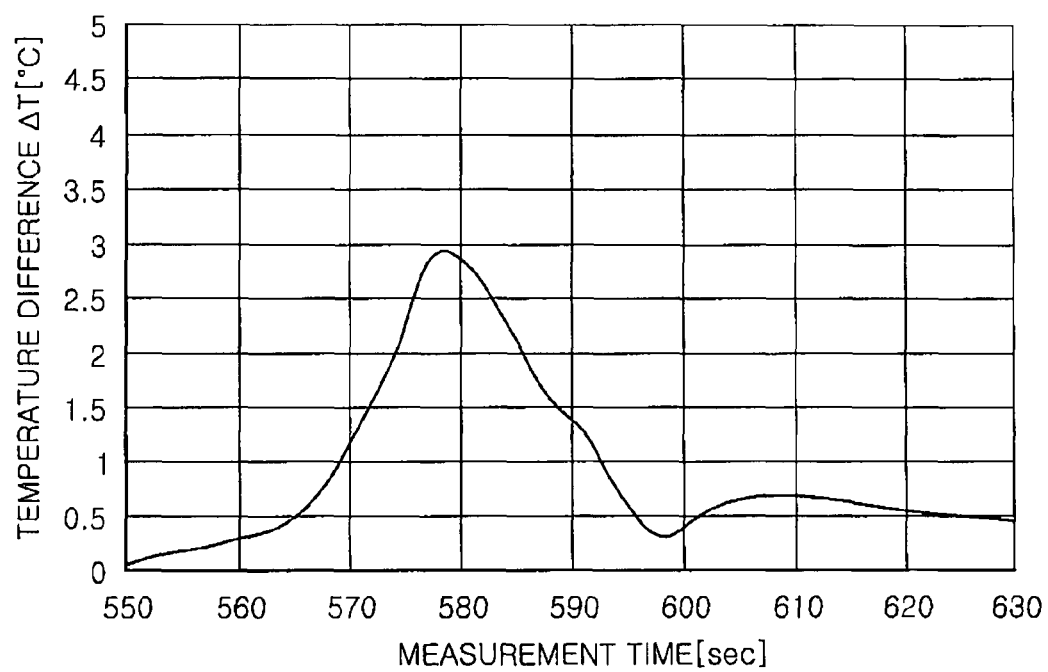
FIG. 23 is a graph of a result of an experiment showing temperature uniformity and temperature increase followability of a wafer mounting table when heating temperature adjustment is performed.

FIG. 23 is a graph of a result of an experiment showing temperature uniformity and temperature increase followability of the wafer mounting table 602 when heating temperature adjustment is performed. In the graph, a horizontal axis represents measurement time and a vertical axis represents a temperature difference ΔT between maximum temperature and minimum temperature of the wafer mounting table 602. From the graph shown in FIG. 23, it can be seen that the temperature difference ΔT is limited to be less than 3° C. even when the temperature of the wafer mounting table 602 is suddenly increased at the rate of about 1° C./sec. In comparison of the graphs of FIGS. 18 and 23, it can be confirmed that the semiconductor fabrication apparatus according to Embodiment 5 has excellent temperature uniformity in temperature increase.

Embodiment 6

Figure 24:
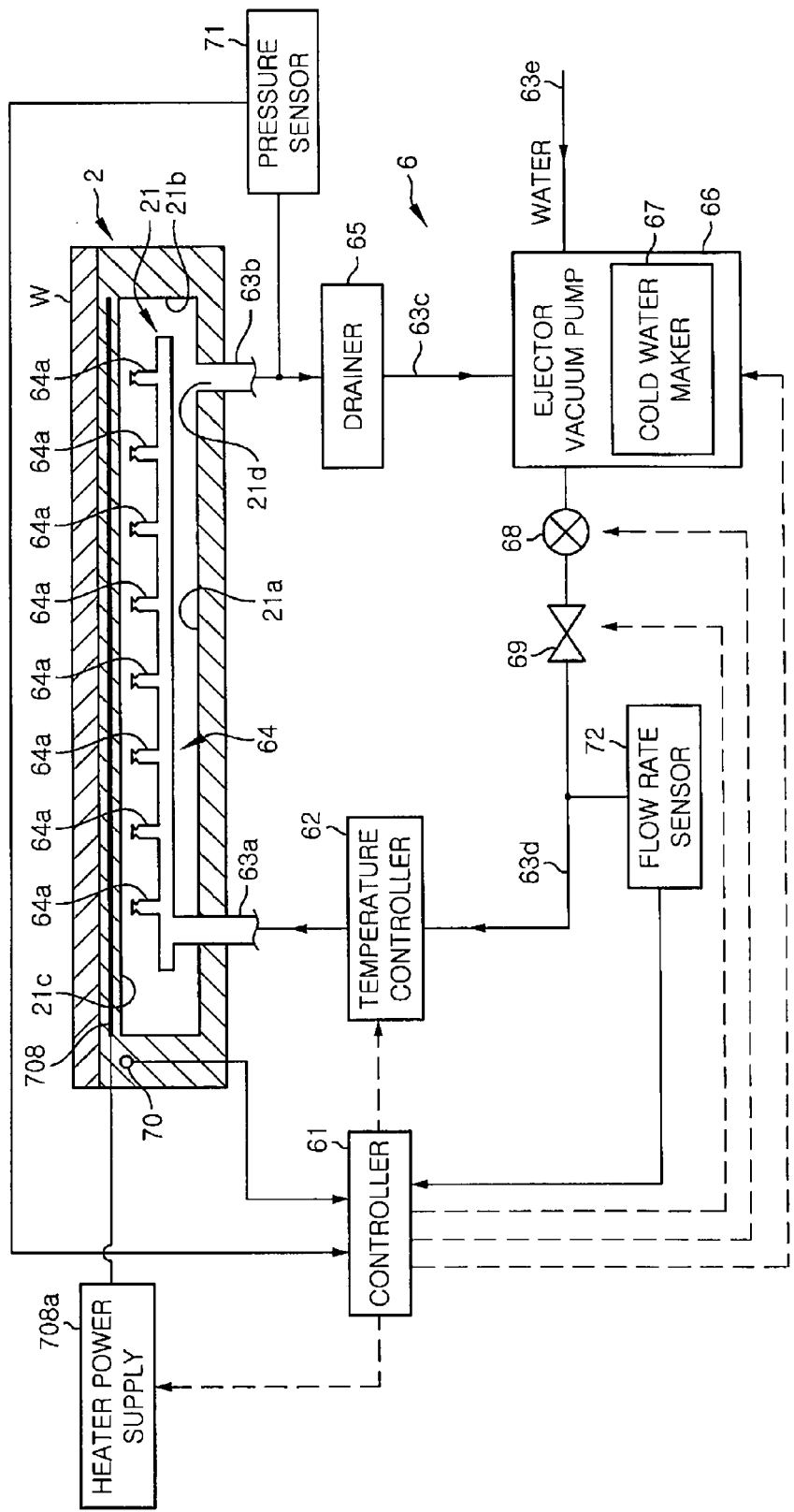
FIG. 24 is a side sectional view of a wafer mounting table constituting a semiconductor fabrication apparatus according to Embodiment 6.

FIG. 24 is a side sectional view of a wafer mounting table 2 constituting a semiconductor fabrication apparatus according to Embodiment 6. The semiconductor fabrication apparatus according to Embodiment 6 has the same structure as that of Embodiment 1 except that the former further includes a heater 708 and a heater power supply 708a. The heater 708 is, for example, a heating wire and is buried in the ceiling inner wall 21c of the wafer mounting table 2 and the heater power supply 708a is configured to heat the wafer mounting table 2 by feeding power to the heater 708. The feeding of power by the heater power supply 708a is controlled by the controller 61.

In Embodiment 6, the wafer mounting table 2 may be cooled by vaporization latent heat of water and the wafer mounting table 2 may be heated by the heater 708. Such employment of the heater 708 as a heating unit allows control of the temperature of the wafer mounting table 2 with a simpler structure.

In addition, the heater 708 may be used to heat the ceiling inner wall 21c in order to evaporate water adhered to the ceiling inner wall 21c when heating is switched to cooling. Similarly, the heater 708 may be used to heat the ceiling inner wall 21c in order to evaporate water adhered to the ceiling inner wall 21c when cooling is switched to heating.

Embodiment 7

A semiconductor fabrication apparatus according to Embodiment 7 is different from the above-described embodiments in that the ceiling inner wall of the wafer mounting table 2 is subjected to surface treatment and therefore a difference therebetween will be mainly described below.

Figure 25:
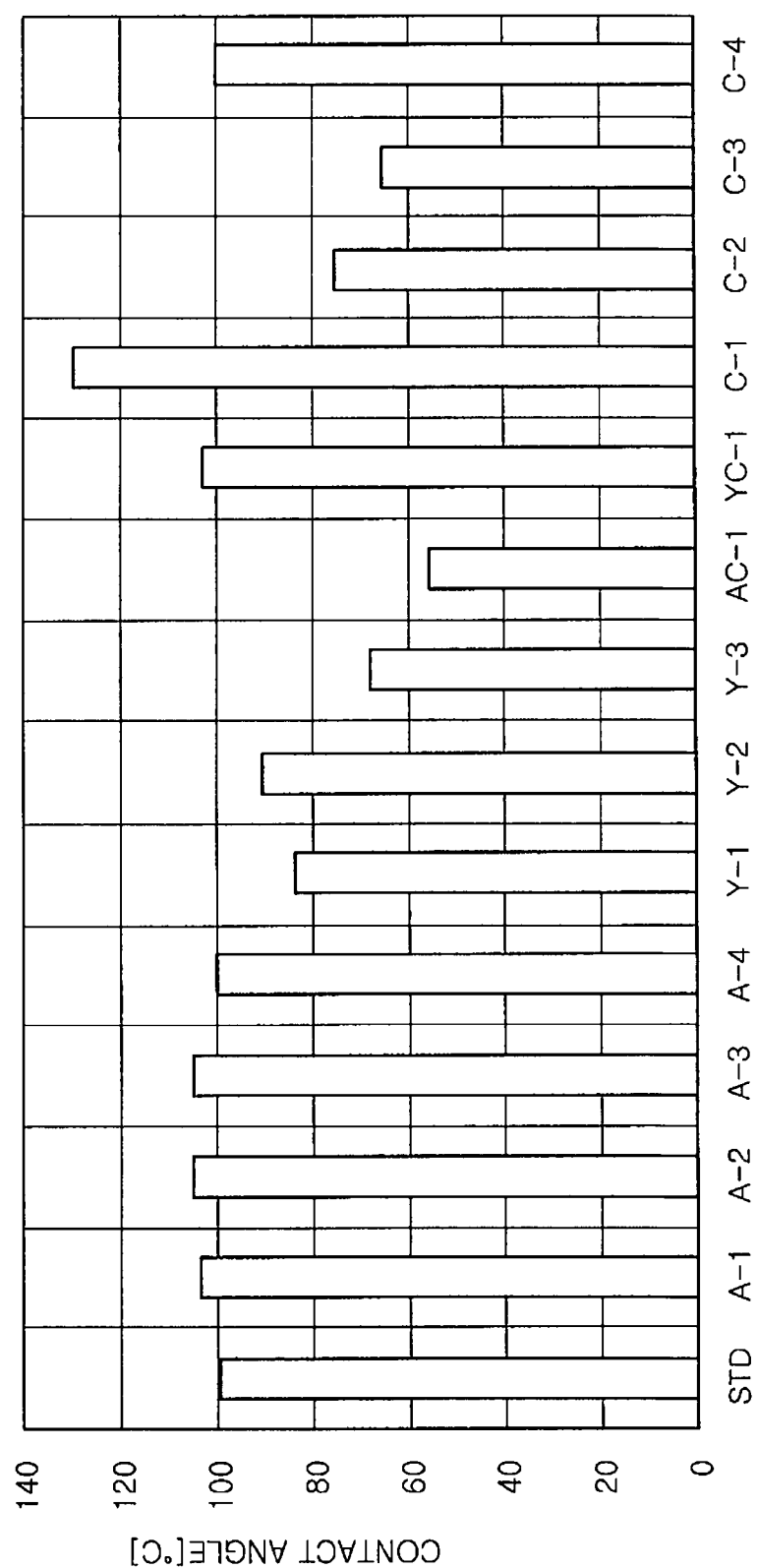
FIG. 25 is a bar graph showing a relationship between type of surface treatment subjected to a ceiling inner wall and a contact angle.

FIG. 25 is a bar graph showing a relationship between type of surface treatment subjected to the ceiling inner wall and a contact angle and FIG. 26 shows a table listing details of the surface treatment. A higher contact angle provides higher hydrophobicity and vice versa.

When heating is performed by feeding saturated vapor into the cavity of the wafer mounting table 2, the ceiling inner wall is preferably subjected to hydrophobic surface treatment. An example of high-hydrophobic surface treatment may include a coating C-1 which is a complex of resin and ceramics, preferably a coating A-3 immersed with ethylsilicate for anode oxidation of aluminum using a hydroxyl acid, or the like. High hydrophobicity may provide increased reform of a heating surface. That is, since water condensed and adhered to the ceiling inner wall is quickly removed and new saturated vapor is adhered to the ceiling inner wall, it is possible to achieve effective vapor heating.

On the other hand, when cooling is performed by jetting water to the ceiling inner wall of the wafer mounting table 2, the ceiling inner wall is preferably subjected to hydrophilic surface treatment. An example of high-hydrophilic surface treatment may preferably include a coating Y-3 by alumina spraying, or the like. High hydrophilicity may provide effective cooling of the wafer mounting table 2 since water is uniformly spread onto the heating surface of the ceiling inner wall to cause water-film boiling.

Embodiment 7 may provide increased temperature increase/decrease efficiency of the wafer mounting table 2.

Embodiment 8

A semiconductor fabrication apparatus according to Embodiment 8 is different in configuration of the nozzle 64a of the water jet 64 from Embodiment 1 and therefore a difference therebetween will be mainly described below. The nozzle 64a according to Embodiment 8 is configured using a micro/nano bubble generator which can jet water mixed with microscopic bubbles having diameter of several hundreds nanometers to 10 micrometers or below by circulating water and air. An example of the micro/nano bubble generator may include M2-LM/PVC available from Nano Planet Laboratory. Details thereof are known in the art (see Japanese Patent No. 3397154) and therefore explanation thereof will be omitted.

In the semiconductor fabrication apparatus according to Embodiment 8, since bubbles were mixed into water, it is possible to promote water evaporation and cool the wafer mounting table 2 more effectively.

The disclosed embodiments are merely examples in all respects and should not be construed to limit the invention. The scope of the invention is defined by the following claims and is intended to encompass all modifications which are within the claims and its equivalents.

What is claimed is:

1. A semiconductor fabrication apparatus comprising:
   a semiconductor wafer mounting table having a cavity therein;
   a nozzle which jets a liquefied temperature adjustment medium having a jet temperature equal to or less than a target temperature to an inner wall of the cavity in order to adjust a temperature of the semiconductor wafer mounting table to the target temperature;
   a temperature detecting unit for detecting the temperature of the semiconductor wafer mounting table;
   a pressure detecting unit for detecting an internal pressure of the cavity;
   a vacuum pump which discharges gas from the cavity; and
   a controller configured to determine a target internal pressure of the cavity and to control the vacuum pump such that, if the temperature detected by the temperature detecting unit exceeds the target temperature, the internal pressure detected by the pressure detecting unit is controlled to become the target internal pressure, and wherein the controller is configured to determine the target internal pressure such that the target internal pressure is equal to or greater than a saturated vapor pressure of the temperature adjustment medium at the jet temperature and also such that the target internal pressure is equal to or less than a saturated vapor pressure of the temperature adjustment medium at the target temperature.

2. The semiconductor fabrication apparatus of claim 1, further comprising:
   a temperature adjustment medium feeding hole which feeds a saturated vaporized temperature adjustment medium having a feed temperature equal to or greater than the target temperature into the cavity in order to adjust the temperature of the semiconductor wafer mounting table to the target temperature;
   wherein the controller is configured to control the vacuum pump such that, if the temperature detected by the temperature detecting unit is less than the target temperature, the internal pressure detected by the pressure detecting unit is controlled to be equal to or greater than the saturated vapor pressure of the temperature adjustment medium at the target temperature and the internal pressure detected by the pressure detecting unit is also controlled to be equal to or less than a saturated vapor pressure of the temperature adjustment medium at the feed temperature.

3. The semiconductor fabrication apparatus according to claim 1, wherein the target temperature is a stored target temperature for a semiconductor fabrication process, and wherein the controller is configured to receive the target temperature and to determine the target internal pressure based on both the target temperature and the jet temperature.

4. A semiconductor fabrication apparatus comprising:
a semiconductor wafer mounting table having a cavity therein;
a temperature adjustment medium feeding hole which feeds a saturated vaporized temperature adjustment medium having a feed temperature equal to or greater than a target temperature into the cavity in order to adjust a temperature of the semiconductor wafer mounting table to the target temperature;
a pressure detecting unit for detecting an internal pressure of the cavity; and
a vacuum pump which discharges gas from the cavity such that the internal pressure detected by the pressure detecting unit is controlled to be equal to or greater than a saturated vapor pressure of the temperature adjustment medium at the target temperature and the internal pressure detected by the pressure detecting unit is also controlled to be equal to or less than a saturated vapor pressure of the temperature adjustment medium at the feed temperature.

5. The semiconductor fabrication apparatus of any one of claims 1 to 3, wherein a bottom inner wall or a ceiling inner wall of the cavity is inclined with respect to a mounting surface on which the semiconductor wafer is mounted and also inclined with respect to a direction perpendicular to the mounting surface.

6. The semiconductor fabrication apparatus according to claim 5, wherein both the bottom inner wall and the ceiling inner wall are inclined with respect to the mounting surface and also with respect to a direction perpendicular to the mounting surface.

7. A temperature adjustment method for adjusting a temperature of a semiconductor wafer mounting table having a cavity therein to a target temperature, wherein the method comprises jetting a liquefied temperature adjustment medium having a jet temperature equal to or less than the target temperature to an inner wall of the cavity, the method further comprising:
detecting an internal pressure of the cavity;
determining a target internal pressure of the cavity such that the target internal pressure is equal to or greater than a saturated vapor pressure of the temperature adjustment medium at the jet temperature and also such that the target internal pressure is equal to or less than a saturated vapor pressure of the temperature adjustment medium at the target temperature; and
controlling the vacuum pump to discharge gas from the cavity;
such that the internal pressure detected by the pressure detecting unit is controlled to become the target internal pressure.

8. The temperature adjustment method according to claim 7, wherein the target temperature is a stored target temperature for a semiconductor fabrication process, and wherein in the step of the determining a target internal pressure the internal pressure is determined based on both the target temperature and the jet temperature.

9. A temperature adjustment method for adjusting a temperature of a semiconductor wafer mounting table having a cavity therein to a target temperature by detecting the temperature of the semiconductor wafer mounting table, wherein the method comprises jetting a liquefied temperature adjustment medium having a jet temperature equal to or less than the target temperature to an inner wall of the cavity if the detected temperature exceeds the target temperature, and feeding a saturated vaporized temperature adjustment medium having a feed temperature equal to or greater than the target temperature into the cavity if the detected temperature is less than the target temperature, the method further comprising:
detecting an internal pressure of the cavity;
discharging gas from the cavity such that, if the detected temperature exceeds the target temperature, the detected pressure is controlled to be equal to or greater than a saturated vapor pressure of the temperature adjustment medium at the jet temperature and the detected pressure is also controlled to be equal to or less than a saturated vapor pressure of the temperature adjustment medium at the target temperature; and
discharging gas from the cavity such that, if the detected temperature is less than the target temperature, the detected pressure is controlled to be equal to or greater than the saturated vapor pressure of the temperature adjustment medium at the target temperature and the detected pressure is also controlled to be equal to or less than a saturated vapor pressure of the temperature adjustment medium at the feed temperature.

10. A temperature adjustment method for adjusting a temperature of a semiconductor wafer mounting table having a cavity therein to a target temperature, wherein the method comprises feeding a saturated vaporized temperature adjustment medium having a feed temperature equal to or greater than the target temperature into the cavity, the method further comprising:
detecting an internal pressure of the cavity; and
discharging gas from the cavity such that the detected pressure is controlled to be equal to or greater than a saturated vapor pressure of the temperature adjustment medium at the target temperature and the detected pressure is also controlled to be equal to or less than a saturated vapor pressure of the temperature adjustment medium at the feed temperature.

* * * * *